US010056144B2

(12) United States Patent
Saitoh

(10) Patent No.: US 10,056,144 B2
(45) Date of Patent: Aug. 21, 2018

(54) NONVOLATILE SEMICONDUCTOR MEMORY DEVICE AND ITS OPERATION PROGRAM

(71) Applicant: Renesas Electronics Corporation, Tokyo (JP)

(72) Inventor: Motofumi Saitoh, Tokyo (JP)

(73) Assignee: Renesas Electronics Corporation, Koutou-ku, Tokyo (JP)

(*) Notice: Subject to any disclaimer, the term of this patent is extended or adjusted under 35 U.S.C. 154(b) by 0 days.

(21) Appl. No.: 15/136,150

(22) Filed: Apr. 22, 2016

(65) Prior Publication Data
US 2016/0379711 A1 Dec. 29, 2016

(30) Foreign Application Priority Data

Jun. 24, 2015 (JP) ................................. 2015-126532

(51) Int. Cl.
*G11C 11/00* (2006.01)
*G11C 13/00* (2006.01)

(52) U.S. Cl.
CPC ...... *G11C 13/0069* (2013.01); *G11C 13/0002* (2013.01); *G11C 13/0064* (2013.01); *G11C 2013/0066* (2013.01)

(58) Field of Classification Search
CPC ............ G11C 13/0069; G11C 13/0002; G11C 13/0064; G11C 2013/0066
USPC ........................................................ 365/148
See application file for complete search history.

(56) References Cited

U.S. PATENT DOCUMENTS

| 8,339,833 | B2 | 12/2012 | Tokiwa et al. | |
|---|---|---|---|---|
| 9,064,573 | B2 | 6/2015 | Kawai et al. | |
| 9,171,617 | B1* | 10/2015 | Park | G11C 13/0069 |
| 2004/0130938 | A1* | 7/2004 | Hamaguchi | G11C 11/5685 365/158 |
| 2007/0008770 | A1* | 1/2007 | Nagao | G11C 11/5614 365/148 |
| 2011/0128773 | A1* | 6/2011 | Azuma | G11C 13/0007 365/148 |
| 2012/0120712 | A1* | 5/2012 | Kawai | G11C 13/0007 365/148 |
| 2012/0236624 | A1* | 9/2012 | Costa | G11C 11/56 365/148 |

(Continued)

FOREIGN PATENT DOCUMENTS

JP 10-125082 A 5/1998
JP 3796851 B2 7/2006

(Continued)

OTHER PUBLICATIONS

Japanese Office Action issued in Japanese Application No. 2015-126532; dated Jun. 26, 2018.

*Primary Examiner* — Viet Q Nguyen
(74) *Attorney, Agent, or Firm* — Sughrue Mion, PLLC

(57) ABSTRACT

According to one embodiment, an operation program of a nonvolatile semiconductor memory device includes: a first step for determining whether data has been sufficiently written to all of a plurality of addresses to which data is to be written; and a second step for writing data to an address to which data has not been sufficiently written among the plurality of addresses to which data is to be written and not writing data to an address to which data has been sufficiently written. The first step and the second step are repeated a predetermined number of times.

21 Claims, 16 Drawing Sheets

(56) References Cited

U.S. PATENT DOCUMENTS

| | | | |
|---|---|---|---|
| 2014/0022832 A1* | 1/2014 | Lee | G11C 13/0069 365/148 |
| 2014/0036572 A1* | 2/2014 | Takagi | G11C 13/0007 365/148 |
| 2014/0185360 A1* | 7/2014 | Kawai | G11C 13/0007 365/148 |
| 2014/0241070 A1* | 8/2014 | Wang | G11C 7/12 365/189.02 |
| 2014/0301129 A1* | 10/2014 | Kawai | G11C 13/0069 365/148 |
| 2014/0321196 A1* | 10/2014 | Ikeda | G11C 13/0064 365/148 |
| 2016/0379711 A1* | 12/2016 | Saitoh | G11C 13/0069 365/148 |

FOREIGN PATENT DOCUMENTS

| | | | |
|---|---|---|---|
| JP | 4322395 B2 | 8/2009 | |
| JP | 2012-64286 A | 3/2012 | |
| JP | 5039079 B2 | 10/2012 | |
| JP | 2014-211937 A | 11/2014 | |

* cited by examiner

NONVOLATILE SEMICONDUCTOR MEMORY DEVICE AND ITS OPERATION PROGRAM

CROSS-REFERENCE TO RELATED APPLICATIONS

This application is based upon and claims the benefit of priority from Japanese patent application No. 2015-126532, filed on Jun. 24, 2015, the disclosure of which is incorporated herein in its entirety by reference.

BACKGROUND

The present invention relates to a nonvolatile semiconductor memory device and its operation program, and relates to, for example, a nonvolatile semiconductor memory device and its operation program that use a variable resistance element.

A memory that holds the contents stored therein even after a power supply is turned off is called a nonvolatile memory (or a nonvolatile semiconductor memory device), and is used for various types of electronic devices in which integration has been enhanced. The nonvolatile memory includes, for example, a flash memory in which data is recorded using a floating gate and data is written by units of blocks and a resistance change type memory (Resistance Random Access Memory, hereinafter it will be referred to as an "ReRAM") which records data using changes in a resistance and can be randomly accessed.

Since the amount of the current necessary to write data into the ReRAM is smaller than that in the flash memory and the writing speed in the ReRAM is higher than that in the flash memory, power consumption can be reduced in the ReRAM. The ReRAM is therefore regarded to be promising as a memory to be mounted on a battery driven portable electronic device or the like.

SUMMARY

In a nonvolatile memory including a plurality of addresses, each formed of one bit, when a verification (determination) is performed for the addresses to which data is to be written, some of the addresses that should be determined to be Fail may be included in a plurality of addresses that have been determined to be Pass at a constant rate. While the number of bits that belong to one address is not disclosed in the following patent literature, one address indicates, for example, one page, and even when the address is formed of a plurality of bits, if each bit included in one address is replaced by an address, the address formed of a plurality of bits is the same as the address formed of one bit.

Japanese Patent No. 5039079 disclosures a verify writing method in the ReRAM. In the method disclosed in Japanese Patent No. 5039079, data is written to an address which has been determined to be Fail and data is not written to an address which has been determined to be Pass. After that, a determination is performed for only the address to which data has been written and both the determination and the writing are skipped for the address to which data has not been written. Such writing and determination are repeated, and when all the addresses to which data is to be written are determined to be Pass, the verify writing processing is completed. As described above, in the method disclosed in Japanese Patent No. 5039079, neither writing or determination is performed for the address which has once been determined to be Pass. Therefore, when the address that should be determined to be Fail since the average value of the resistance of the address (average resistance value) is equal to or lower than a determination threshold has been accidentally determined to be Pass (erroneous Pass), it is impossible to detect that this address is Fail after the determination is performed. Therefore, the address that has once been determined to be Pass is not sufficiently checked. Therefore, in the method disclosed in Japanese Patent No. 5039079, the accuracy of the writing is not high.

Japanese Patent No. 5039079 discloses, in the comparative example, a method of performing data writing and a determination a predetermined number of times for all the addresses to which data is to be written without skipping the writing and the determination regardless of whether the address is a Pass address or a Fail address. Since data is also written to the Pass address in the method of the comparative example, this writing may be an excessive writing. This causes various problems. It is therefore impossible to improve the accuracy of the writing in the comparative example.

Japanese Patent No. 4322395 discloses a verify writing method having a test mode in a flash memory. The method disclosed in Japanese Patent No. 4322395 is a method of writing data in a test mode in which the stress of the voltage is set to worst conditions, and data is written to an address which has been determined to be Pass. Further, even when all the addresses by units of pages are determined to be Pass, writing is not completed and the determination and the writing are repeated a predetermined number of times in this method, while the determination is performed for the address that has been determined to be Pass, various problems may occur due to an excessive writing. As a result, it is impossible to improve the accuracy of writing.

Japanese Patent No. 3796851 discloses a method of performing a re-determination after a verify writing is completed in a flash memory, detecting an address that has been determined to be Fail, and performing verify writing on the address that has been detected. In the method disclosed in Japanese Patent No. 3796851, data is written to the address which has been determined to be Fail and neither determination nor writing is performed for the address which has once been determined to be Pass. When all the addresses to which data is to be written become Pass addresses, the verify writing is completed. In the method disclosed in Japanese Patent No. 3796851 as well, the determination is not performed for the address which has once been determined to be Pass. Therefore, there may be an erroneous Pass address. In the method disclosed in. Japanese Patent No. 3796851 as well, it is impossible to improve the accuracy of writing.

As described above, in the verify writing methods disclosed in Japanese Patent No. 5039079, Japanese Patent No. 4322395, and Japanese Patent No. 3796851, it is impossible to improve the accuracy of writing.

The other problems of the related art and the novel characteristics of the present invention will be made apparent from the descriptions of the specification and the accompanying drawings.

According to one embodiment, an operation program of a nonvolatile semiconductor memory device includes: a first step for determining whether data has been sufficiently written to all of a plurality of addresses to which data is to be written; and a second step for writing data to an address to which data has not been sufficiently written among the plurality of addresses to which data is to be written and not writing data to an address to which data has been sufficiently written. The first step and the second step are repeated a predetermined number of times.

According to the embodiment, it is possible to improve the accuracy of writing of the nonvolatile semiconductor memory device.

BRIEF DESCRIPTION OF THE DRAWINGS

The above and other aspects, advantages and features will be more apparent from the following description of certain embodiments taken in conjunction with the accompanying drawings, in which:

FIG. 15 is a diagram that exemplifies a resistance and the number of normalized addresses of the nonvolatile semiconductor memory device according to the second embodiment and the nonvolatile semiconductor memory device according to the comparative example, with a horizontal axis indicating a resistance value and a vertical axis indicating the number of normalized addresses; and.

DETAILED DESCRIPTION

Figure 1:
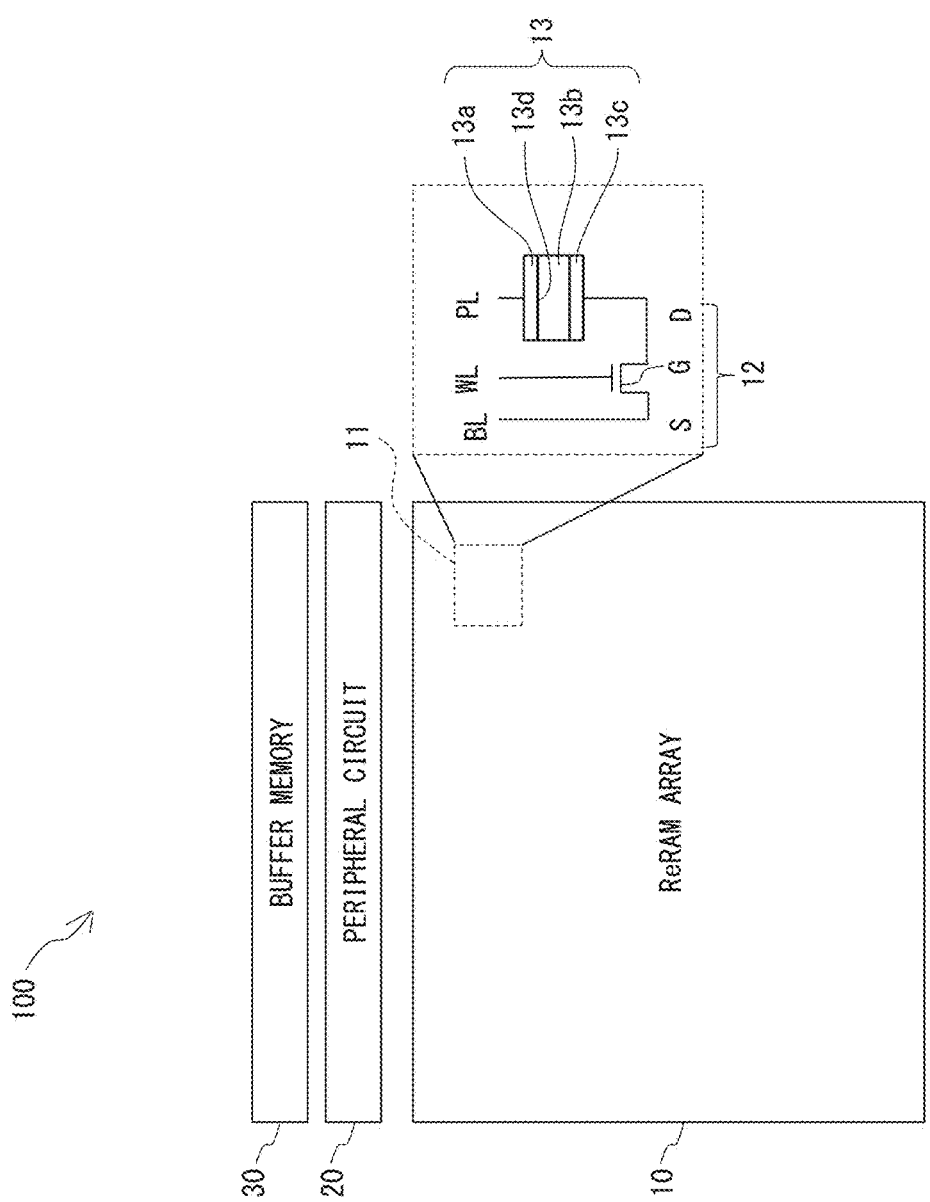
FIG. 1 is a diagram that exemplifies a nonvolatile semiconductor memory device according to a first embodiment.

For the clarification of the description, the following description and the drawings may be omitted or simplified as appropriate. Further, each element shown in the drawings as functional blocks that perform various processing can be formed or a CPU, a memory, and other circuits in hardware and may be implemented by programs loaded in the memory in software. Those skilled in the art will therefore understand that these functional blocks may be implemented in various ways by only hardware, only software, or the combination thereof without any limitation. Throughout the drawings, the same components are denoted by the same reference symbols and overlapping descriptions will be omitted as appropriate.

(First Embodiment)

A first embodiment will be described in this embodiment, a nonvolatile semiconductor memory device, an operation method, and an operation program will be described. First, a configuration of a nonvolatile semiconductor memory device according to this embodiment will be described.

FIG. 1 is a diagram that exemplifies a nonvolatile semiconductor memory device 100 according to the first embodiment.

As shown in FIG. 1, the nonvolatile semiconductor memory device 100 includes an ReRAM array 10, a peripheral circuit 20, and a buffer memory 30. The peripheral circuit 20 is arranged around the ReRAM array 10. The buffer memory 30 is adjacent to the peripheral circuit 20.

The ReRAM array 10 includes a plurality of addresses. For example, each address is formed of one bit. The ReRAM array 10 includes a plurality of memory elements 11 corresponding to the plurality of respective addresses and the plurality of memory elements 11 are arranged in matrix. The plurality of memory elements 11 in the ReRAM array 10 include, for example, a structure formed of one transistor 12 and one variable resistance element 13 (hereinafter this structure will be referred to as a "1Tr1R structure").

The transistor 12 in the 1Tr1R structure is a typical field-effect transistor (FET). The transistor 12 is used, for example, as a cell selection transistor. The source terminal S of the transistor 12 is connected to a bit line BL. The gate terminal G of the transistor 12 is connected to a word line WL. The drain terminal D of the transistor 12 is connected to the variable resistance element 13.

The variable resistance element 13 includes a structure in winch an upper metal 13a, a variable resistance layer 13b, and a lower electrode 13c are laminated in this order (MIM structure). The lower electrode 13c of the variable resistance element 13 is connected to the drain terminal D of the transistor 12. The upper electrode 13a of the variable resistance element 13 is connected to a plate line PL. The lower electrode 13c is made of ruthenium (Ru). The thickness of the lower electrode 13c is 10 nm. The upper electrode 13a is made of tungsten (W) coated by a tantalum nitride layer (TaN layer). The thickness of the coating layer of tantalum nitride (TaN) is 2 nm. The thickness of tungsten is 10 nm.

The variable resistance layer 13b is interposed between the upper electrode 13a and the lower electrode 13c. The variable resistance layer 13a includes a tantalum nitride layer (TaOx layer) having an oxygen deficiency and a tantalum layer (Ta layer), which is an oxygen withdrawing layer. The thickness of the TaOx layer is about 5 nm. The thickness of the Ta layer is 2 nm. An insulating layer 13d is provided between the upper electrode 13a of the variable resistance element 13 and the Ta layer or between the lower electrode 13c and the TaOx layer. A circular hole or a rectangular hole which is close to a square having a diameter of 100 nm or an area similar to that is provided in the insulating layer 13d. The area of the variable resistance element 13 here means an area of the hole opened in the insulating layer 13d, not the area of the upper electrode 13a and the lower electrode 13c. The part that extends to the lower electrode 13c from the upper electrode 13a through this hole has a laminated structure of W/TaN/Ta/TaOx/Ru. The part around it does not serve as the variable resistance layer 13b since the insulating layer 13d exists below the upper electrode 13a or above the lower electrode 13c.

Figure 2:
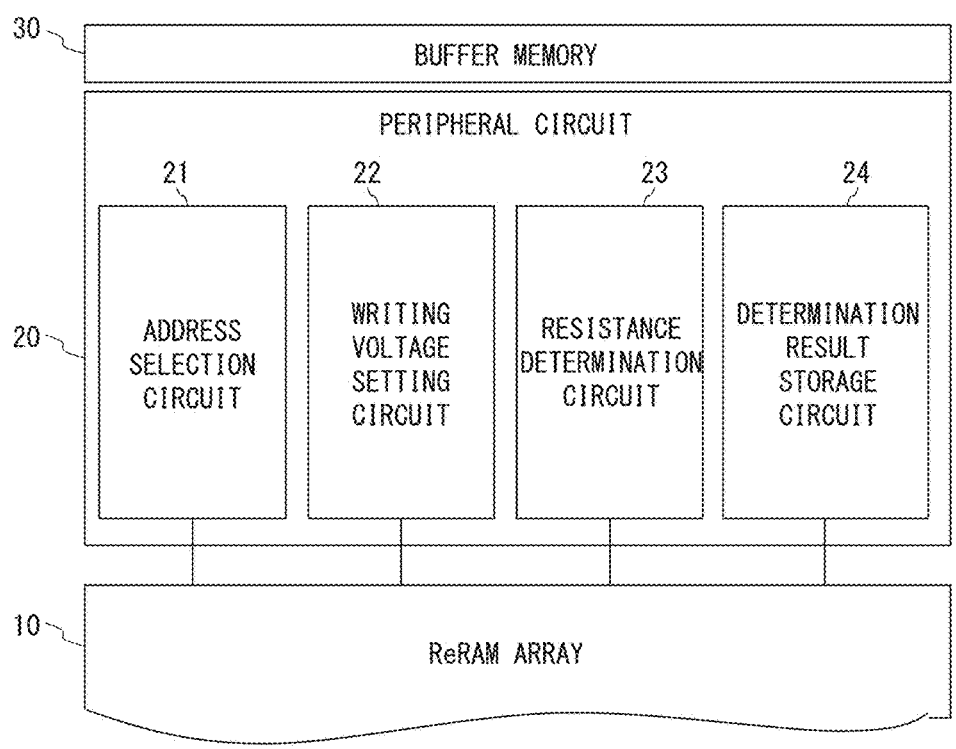
FIG. 2 is a diagram that exemplifies a peripheral circuit according to the first embodiment.

FIG. 2 is a diagram that exemplifies the peripheral circuit according to the first embodiment.

As shown in FIGS. 1 and 2, the peripheral circuit 20 includes an address selection circuit 21, a writing voltage setting circuit 22, a resistance determination circuit 23, and a determination result storage circuit 24. The address selection circuit 21, the writing voltage setting circuit 22, the resistance determination circuit 23, and the determination result storage circuit 24 are electrically connected to the memory element 11 the ReRAM array 10.

The address selection circuit 21 selects the memory element 11 in the ReRAM array 10. The address selection circuit 21 is connected, for example, to the word line WL or the bit line BL. The address selection circuit 21 selects a plurality of variable resistance elements 13 to which data is to be written from the plurality of variable resistance elements 13. For example, the address selection circuit 21 applies a voltage to the gate terminal G of the transistor 12 via the word line WL. Accordingly, the gate of the transistor 12 is opened and the resistance of the variable resistance element 13 can be increased or decreased.

The writing voltage setting circuit 22 writes data to the memory element 11 selected by the address selection circuit 21. The writing voltage setting circuit 22 is connected, for example, to the source terminal S of the transistor 12 via the bit line BL. The writing voltage setting circuit 22 applies a voltage to the source terminal S of the transistor 12 selected by the address selection circuit 21 via the bit line BL. Accordingly, the writing voltage setting circuit 22 writes data to increase the resistance of the variable resistance element 13. In this way, the writing voltage setting circuit 22 sets the resistance of the variable resistance element 13. The writing voltage setting circuit 22 may be connected to the variable resistance element 13 via the plate line PL as long as the writing voltage setting circuit 22 is able to set the resistance of the variable resistance element 13.

The resistance determination circuit 23 is connected to the plate line PL. The resistance determination circuit 23 draws out the voltage applied to the variable resistance element 13 via the plate line PL. The resistance determination circuit 23 amplifies the voltage that has been drawn out and determines whether the resistance of the variable resistance element 13 is higher or lower than a determination threshold.

The determination result storage circuit 24 is connected to the resistance determination circuit 23. The determination result storage circuit 24 stores the result of the determination in the resistance determination circuit 23. The determination result storage circuit 24 stores the result (Pass or Fail) in each address to which data is to be written. The buffer memory 30 is a memory to temporarily hold data to be written.

Next, an operation of the nonvolatile semiconductor memory device 100 according to this embodiment will be described. First, a verify writing operation in Off writing of the nonvolatile semiconductor memory device 100 according to this embodiment will be described.

Figure 3:
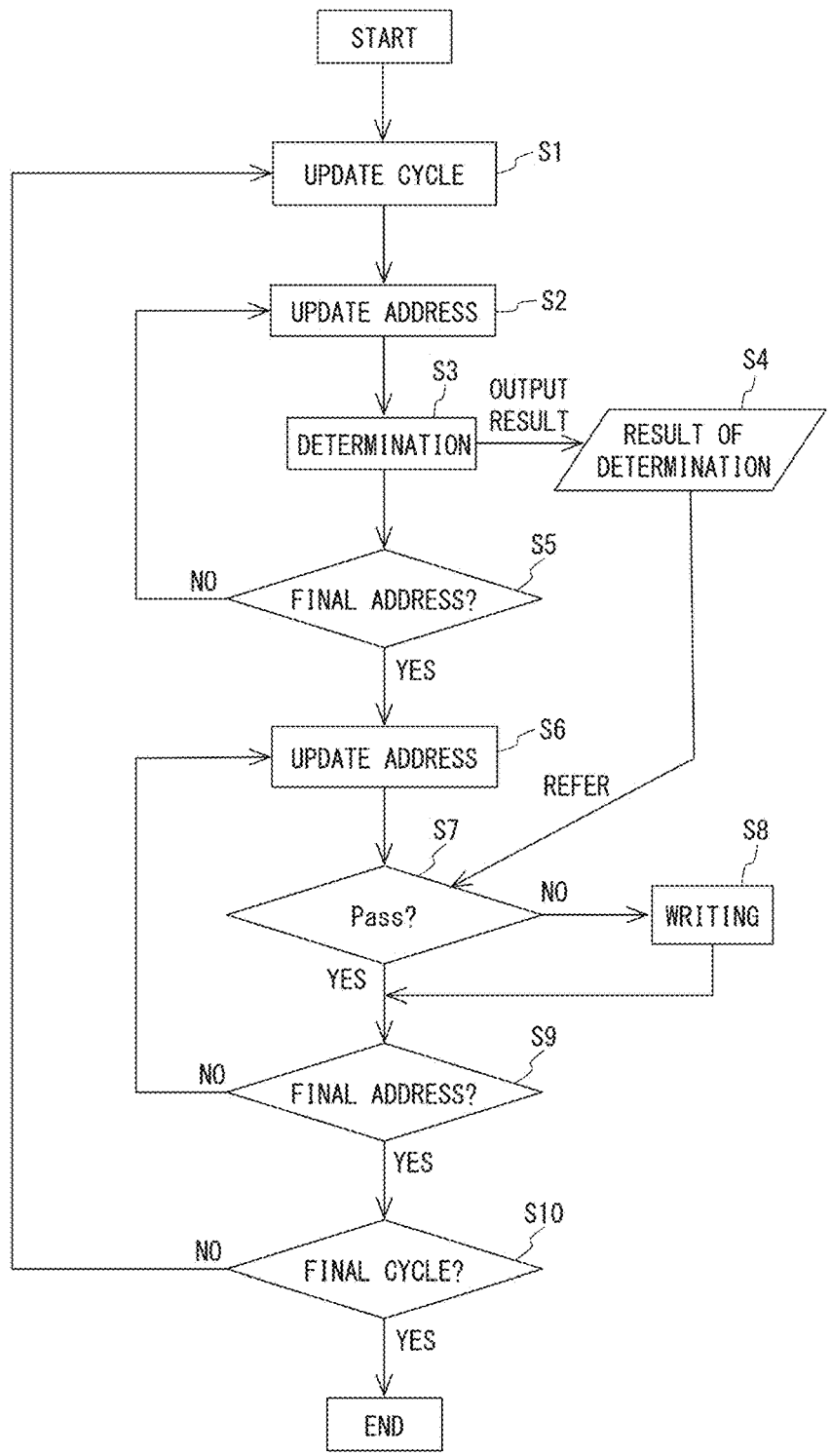
FIG. 3 is a flowchart that exemplifies an Off writing operation of the nonvolatile semiconductor memory device according to the first embodiment.

FIG. 3 is a flowchart that exemplifies an Off writing operation of the nonvolatile semiconductor memory device 100 according to the first embodiment.

As shown in Step S1 of FIG. 3, the Off writing operation is started from an update of a cycle. And initial value in the update or the cycle is set, for example, to 0. The final cycle is the last cycle of a predetermined number of times e.g., 10 to 100 times). In this way, the cycle is repeated a predetermined number of times (e.g., 100 times) The predetermined number of times is determined according to the number of addresses, the reliability of the variable resistance element 13 or the like. The configuration of the nonvolatile semiconductor memory device 100 has already been shown in FIGS. 1 and 2.

Next, as shown in Step S2, the address is updated. The update of the address is to cycle through the addresses one by one to determine the address to which data is to be written. The plurality of addresses to which data is to be written can be randomly accessed. The initial value is set, for example, to an address 0. The final address is an address which finally remains when the addresses to which data i be written are processed one by one. Specifically, the update of the address is performed by selecting a plurality of variable resistance elements 13 corresponding to the plurality of addresses to which data is to be written by the address selection circuit 21 and cycling through the variable resistance elements 13 one by one. The data may be written to the address by units of pages or by units of blocks.

Next, as shown in Step S3, a determination is performed. In Step S3, it is determined whether data has been sufficiently written or has not been sufficiently written to the plurality of addresses to which data is to be written. The address to which data has been sufficiently written is referred to as a Pass address and the address to which data has not been sufficiently written is referred to as a Fail address. The former address may also be called a Pass and the latter address may also be called a Fail. Specifically, the determination is performed by the resistance determination circuit 23, which determines whether the resistance is higher or lower than the determination threshold for all the plurality of variable resistance elements 13 to which data is to be written selected by the address selection circuit 21. The resistance determination circuit 23 outputs to the determination result storage circuit 24 the determination result, indicating the address in which the resistance is high being the Pass and the address in which the resistance is low being the Fail. Since the Off writing is described here, the variable resistance element 13 to which data is to be written is the address to which Off data stored in the buffer memory 30 is to be written.

Next, as shown in Step S4, the result of the determination is stored. Specifically, the determination result storage circuit stores the result of the determination performed for the plurality of variable resistance elements 13 by the resistance determination circuit 23. The determination result storage circuit 24 stores the result of the determination for each address. When the result of the determination for each address has already been stored, the result of the determination is overwritten.

Next, as shown in Step S5, it is determined whether the address is the final address. When the address is not the final address (No), the process goes back to Step S2. Accordingly, the address is updated and the next address is selected. When the address is the final address (Yes), the process goes to Step S6.

Next, as shown in Step S6, the address is updated. The update of the address in Step S6 is to cycle through the addresses to additionally write data to the address to which data is to be written. The address is updated in a method similar to Step S2 described above. That is, the initial value is, for example, reset to 0. The final address is the address that finally remains when the addresses to which data is to be written are processed one by one.

Next, as shown in Step S7, the result of the determination stored in the determination result storage circuit 24 is referred and it is determined whether the address that has been selected is Pass or Fail.

Next, as shown in Step S8, when the address that has been selected among the plurality of addresses to which data is to be written is not. Pass (No), that is, when data has not been sufficiently written to the address, data is written to this address. Specifically, the writing voltage setting circuit 22 applies a saturation current of 175 µA to the bit line BL using a voltage of 2.2 V at a pulse width of 20 ns. Accordingly, the writing voltage setting circuit 22 writes data to the variable resistance element 13 in which the resistance is lower than the determination threshold among the plurality of variable resistance elements 13 to which data is to be written to increase the resistance. The process then goes to Step S9. When the address that has been selected is Pass (Yes), that is, when data has been sufficiently written to this address, data is not written to this address any more. Specifically, the writing voltage setting circuit 22 does not write data to the variable resistance element 13 in which the resistance is higher than the determination threshold to increase the resistance. The writing voltage setting circuit 22 performs the above processing. The process then goes to Step S9.

Next, as shown in Step S9, it is determined whether the address is the final address. When the address is not the final address (No), the process goes back to Step S6. Accordingly, the address is updated and the next address is selected. When the address is the final address (Yes), the process goes to Step S10.

Next, as shown in Step S10, it is determined whether the cycle is the final cycle. When the cycle is not the final cycle (No), the process goes back to Step S1. In this way, this cycle is repeated. Therefore, a determination is performed for the address to which data has been written and the address to which data has not been written. Specifically, the resistance determination circuit 23 performs a determination on the variable resistance element 13 in which data has been written to increase the resistance and the variable resistance element 13 in which data has not been written to increase the resistance. In this way, the cycle is repeated a predetermined number of times. On the other hand, when the cycle is the final cycle (Yes), the verify writing processing is completed.

As described above, this embodiment includes Step S3 in which it is determined whether data has been sufficiently written to all the plurality of addresses to which data is to be written and Step S8 in which data is written to the address to which data has not been sufficiently written among the plurality of addresses to which data is to be written and data is not written to the address to which data has been sufficiently written, and Step S3 and Step S8 are repeated a predetermined number of times. Therefore, Step S3 in which the determination is performed for the address to which data has been written and the address to which data has not been written is also repeated.

More specifically, this embodiment includes the process in which it is determined whether each of the plurality of variable resistance elements 13 to which data is to be written is the variable resistance element 13 in which the resistance is higher than the determination threshold (hereinafter it will be referred to as a "high resistance element") or the variable resistance element 13 in which the resistance is lower than the determination threshold (hereinafter it will be referred to as a "low resistance element") and the process in which data is written to the low resistance element among the plurality of variable resistance elements 13 to which data is to be written to increase the resistance and data is not written to the high resistance element among the plurality of variable resistance elements 13 to which data is to be written to increase the resistance, and these processes are repeated a predetermined number of times. Accordingly, the process in which the determination is performed for the low resistance element in which data has been written to increase the resistance and the high resistance element in which data has not been written to increase the resistance is also repeated.

Even when all the addresses to which data is to be written are Pass in the determination in Step S3, the process is not completed. Therefore, in Step S8 except for the last cycle, there is at least one time among the predetermined number of times that Step S8 is repeated where the address to which data has not been sufficiently written is not included. Specifically, even in the state in which it is stored that there is no low resistance element in the determination result storage circuit 24, the processes in the resistance determination circuit 23 and the voltage setting circuit 22 are repeated. That is, in Step S8 except for the last cycle, there is at least one time among the predetermined number of times that Step S8 is repeated where the low resistance element is not included.

The operation method of the nonvolatile semiconductor memory device 100 described above may be an operation program.

Further, the operation program may be executed by a computer. In this case, the operation program includes a first step (procedure) for causing the computer to determine whether data has been sufficiently written to all the plurality of addresses to which data is to be written and a second step (procedure) for causing the computer to write data to the address to which data has not been sufficiently written among the plurality of addresses and causing the computer not to write data to the address to which data has been sufficiently written and causes the computer to repeat the first step (procedure) and the second step (procedure) a predetermined number of times.

More specifically, the operation program of the nonvolatile semiconductor memory device 100 includes the first step (procedure) for causing the computer to determine whether each of the plurality of respective variable resistance elements 13 to which data is to be written is the high resistance element in which the resistance is higher than the determination threshold or the low resistance element in which the resistance is lower than the determination threshold and the second step (procedure) for causing the computer to write data to the low resistance element among the plurality of variable resistance elements 13 to increase the resistance and causing the computer not to write data to the high resistance element and causes the computer to repeat the first step (procedure) and the second step (procedure) a predetermined number of times.

Next, the verify writing operation in forming and On writing of the nonvolatile semiconductor memory device 100 according to this embodiment will be described.

Figure 4:
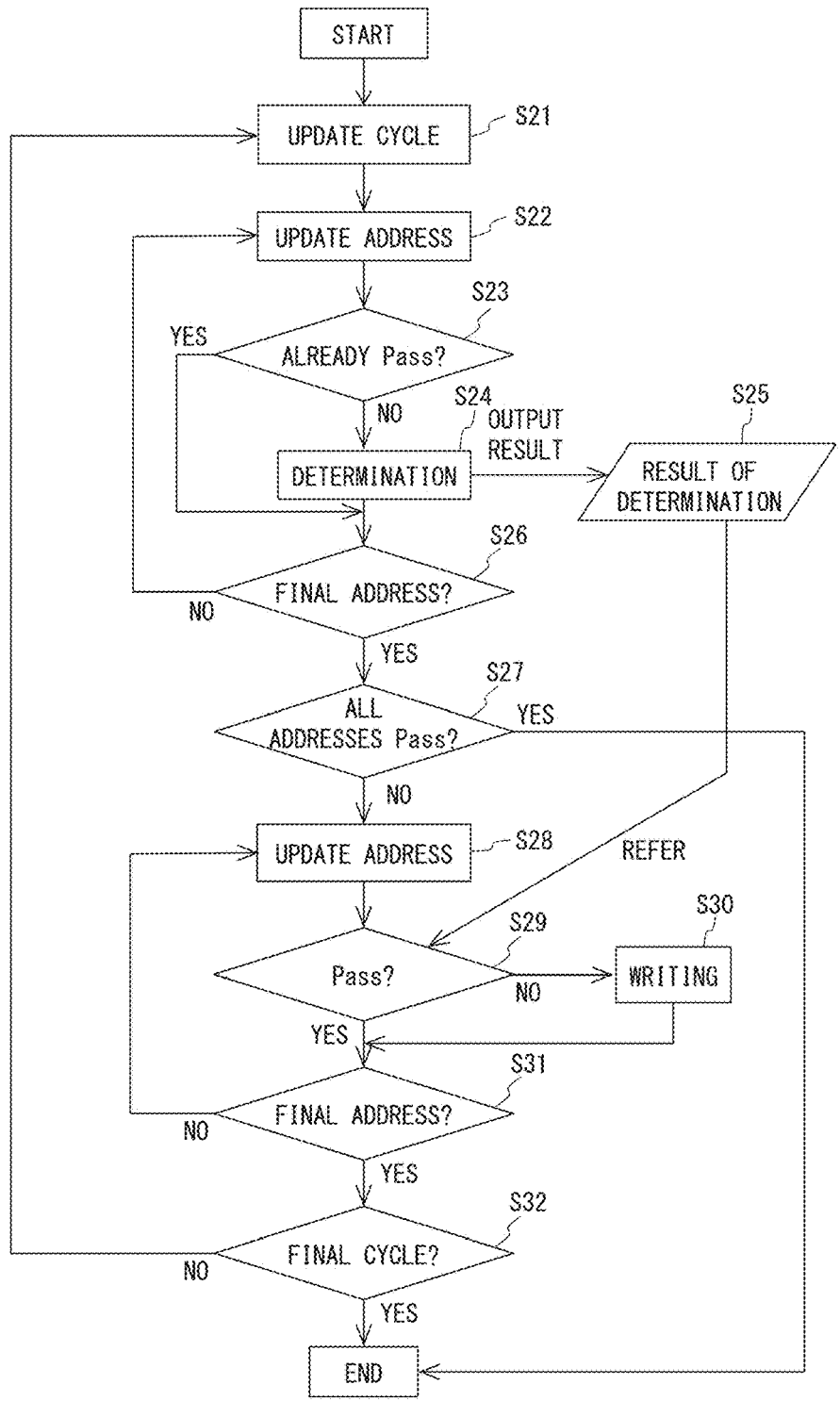
FIG. 4 is a flowchart that exemplifies forming and an On writing operation of the nonvolatile semiconductor memory device according to the first embodiment.

FIG. 4 is a flowchart that exemplifies the forming and the On writing operation of the nonvolatile semiconductor memory device according to the first embodiment.

As shown in Step S21 in FIG. 4, the cycle is updated first. The update of the cycle is performed by resetting the determination result, that is, by setting all the addresses to which data is to be written to Fail. The final cycle is set to a predetermined number of times (e.g., 100 times) The configuration of the nonvolatile semiconductor memory device 100 is shown in FIGS. 1 and 2.

Next, as shown in Step S22, the address is updated. The update of the address is to cycle through the addresses to determine the address to which data is to be written.

Next, as shown in Step S23, it is determined, for the addresses to which data is to one written, the determination result that has been stored has already become Pass. When the determination result stored in the determination result storage circuit 24 is not Pass (No), the process goes to Step S24. When the determination result stored in the determination result storage circuit 24 is Pass (Yes), the process goes to Step S26.

Next, as shown in Step S24, the determination result stored in the determination result storage circuit 24 is not Pass (No it is determined whether On writing has been sufficiently performed.

As shown in Step S25, when the result of the determination is Pass, the result of the determination is updated. Accordingly, the address which is in the On state among the addresses to which data is to be written is stored as Pass in the determination result storage circuit 24 and the address which is not in the On state is stored as Fail in the determination result storage circuit 24. The process then goes to Step S26.

As shown in Step S26, it is determined whether the address is the final address. When the address is not the final address (No), the process goes back to Step S22. Accordingly, the address is updated and the next address is selected. When the address is the final address (Yes), the process goes to Step S27.

Next, as shown in Step S27, it is determined whether all the addresses to which data is to be written are Pass. When all the addresses are Pass (Yes), the verify writing processing in the forming and the On writing is completed. When not all of the addresses are Pass (No), the process goes to Step S28.

Next, as shown in Step S28, the address is updated. The update of the address in Step S28 is to cycle through the addresses to additionally write data to the addresses to which data is to be written. The address is updated in a way similar to the above Step S22.

Next, as shown in Step S29, it is determined whether the address that has been selected is Pass or Fail by referring to the determination result stored in the determination result storage circuit 24. When the address that has been selected is Fail (No), the process goes to Step S30. When the address that has been selected is Pass (Yes), the process goes to Step S31.

Next, as shown in Step S30, data writing is performed. When the address that has been selected among the plurality of addresses to which data is to be written is not Pass (No), that is, when data has not been sufficiently written to the address, data is written to only this address. Specifically, in the case of the forming, the resistance of the determination threshold is set to 14 kΩ. The writing voltage setting circuit 22 causes, for example, a saturation current of 175 µA to flow through the transistor 12 through the word line WL and applies a pulse of 1 µs to the plate line PL with a voltage of 3.0 V. The writing voltage setting circuit 22 therefore writes data to only the address to which data has not been sufficiently written. In the case of the On writing, the writing voltage setting circuit 22, causes, for example, a saturation current of 175 µA to flow through the transistor 12 through the word line WL and applies a pulse of 1 µs to the plate line PL with a voltage of 2.2 V. The writing voltage setting circuit 22 therefore writes data to only the address to which data has not been sufficiently written. In the forming, data is written only once after the nonvolatile semiconductor memory device 100 is manufactured.

When the address that has been selected is Pass (Yes), data is not written to the address to which data has been sufficiently written. Specifically, data is not written to the high resistance element to increase the resistance. In this case, the process goes to Step S31.

Next, as shown in Step S31, it is determined whether the address is the final address. When the address is not the final address (No), the process goes back to Step S28. Accordingly, the address is updated and the next address is selected. When the address is the final address (Yes), the process goes to Step S32.

Next, as shown in Step S32, it is determined whether the cycle is the final cycle. When the cycle is not the final cycle (No), the process goes back to Step S21. The cycle is therefore repeated. On the other hand, when the cycle is the final cycle (Yes), the process ends.

As described above, in the case of the forming and the ON writing, the verify writing processing is completed when all the addresses become Pass or the above operation is repeated a predetermined number of times.

Next, a reading operation of the nonvolatile semiconductor memory device 100 according to this embodiment will be described.

Figure 5:
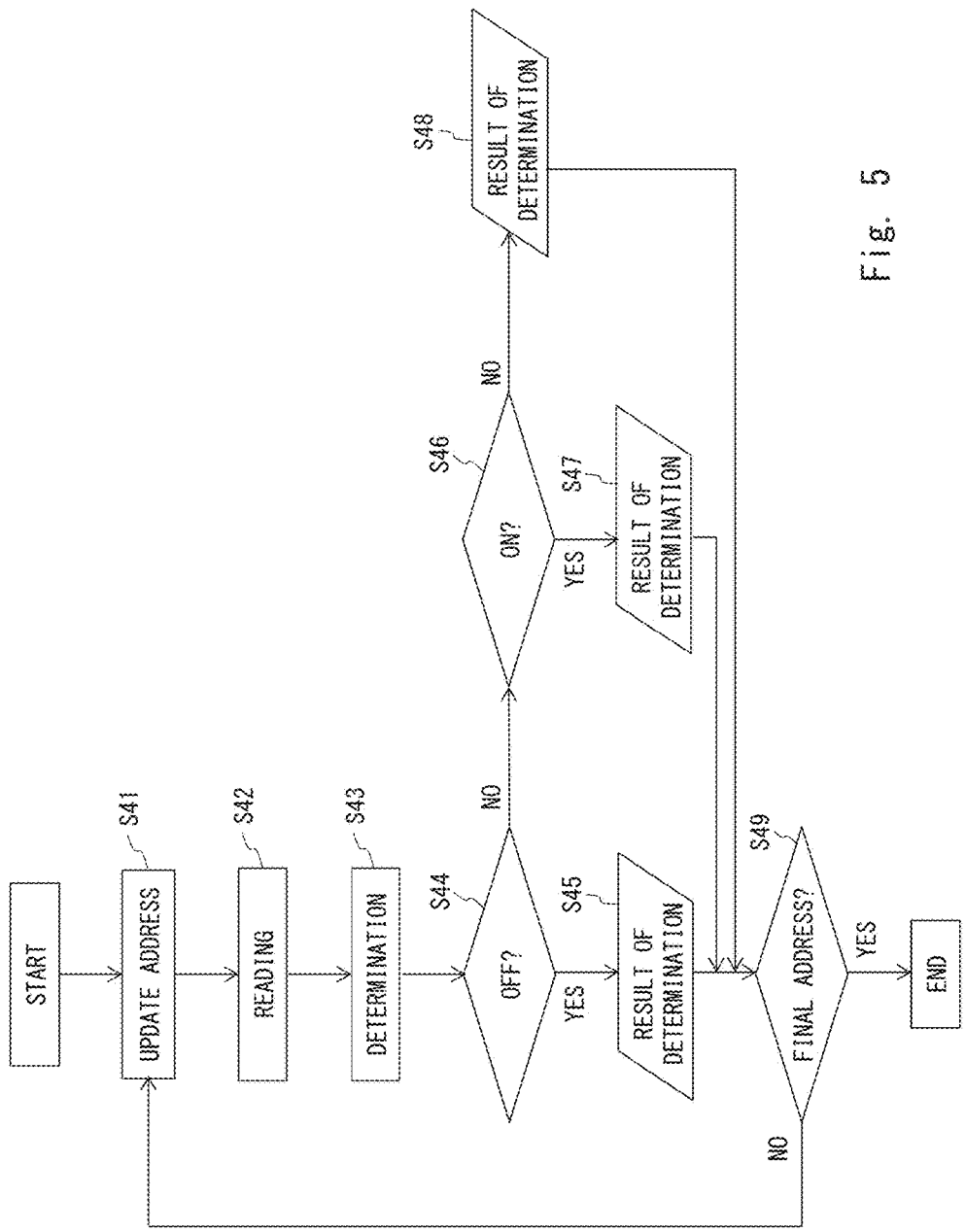
FIG. 5 is a flowchart that exemplifies a reading operation of the nonvolatile semiconductor memory device according to the first embodiment.

FIG. 5 is a flowchart that exemplifies the reading operation of the nonvolatile semiconductor memory device according to the first embodiment.

As shown in Step S41 of FIG. 5, first, the address is updated. The update of the address is to cycle through the addresses to read the state of each address from which data is to be read out. The configuration of the nonvolatile semiconductor memory device 100 has already been shown in FIGS. 1 and 2.

Next, as shown in Step S42, data is read out. Here, the state of each address from which data is to be read out is read out. Specifically, the resistance values of the variable resistance elements 13 corresponding to the respective addresses are measured.

Next, as shown in Step S43, a determination is performed. In this determination, the state of each address from which data is to be read out is determined. Specifically, the determination is performed by measuring the resistance values of the variable resistance elements 13 corresponding to the addresses.

Next, as shown in Step S44, it is determined whether the state of the address is in the OFF state. For example, when a reading determination threshold of the Off state is set to 100 kΩ, it is determined whether the resistance of the variable resistance element 13 is equal to or larger than 100 kΩ. When the resistance of the variable resistance element 13 is equal to or larger than 100 KΩ (Yes), the process goes to Step S45. When the resistance of the variable resistance element 13 is smaller than 100 kΩ (No), the process goes to Step S46.

Next, as shown in Step S45, when the resistance of the variable resistance element 13 is equal to or larger than 100 kΩ, a determination result indicating that this address is in the Off state is output. The process then goes to Step S49.

As shown in Step S46, when the resistance of the variable resistance element 13 is lower than 100 kΩ, it is determined whether the state the On state. Specifically, when the reading determination threshold of the On state is 50 kΩ, it is determined whether the resistance of the variable resistance element 13 is lower than 50 kΩ. When the resistance of the variable resistance element 13 is lower than 50 kΩ (Yes), the process goes to Step S47. When the resistance of the variable resistance element 13 is equal to or larger than 50 kΩ (No), the process goes to Step S48.

Next, as shown in Step S47, when the resistance of the variable resistance element 13 is lower than 50 kΩ, this address is determined to be the On state. Then the determination result indicating that this address is in the On state is output. The process then goes to Step S49.

As shown in Step S48, when the resistance of the variable resistance element 13 is from 50 kΩ (inclusive) to 100 kΩ (exclusive), a determination result indicating that this address is an error is output. When the number of errors is within a predetermined number, a redundant address or the like is used. The process then goes to Step S49.

Next, as shown in Step S49, it is determined whether the address is the final address. When the address is not the final address (No), the process goes back to Step S41. Accordingly, the address is updated and the next address is selected. When the address is the final address (Yes), the reading process is completed.

Next, the state of each address in the Off writing operation in this embodiment will be described.

Figure 6:
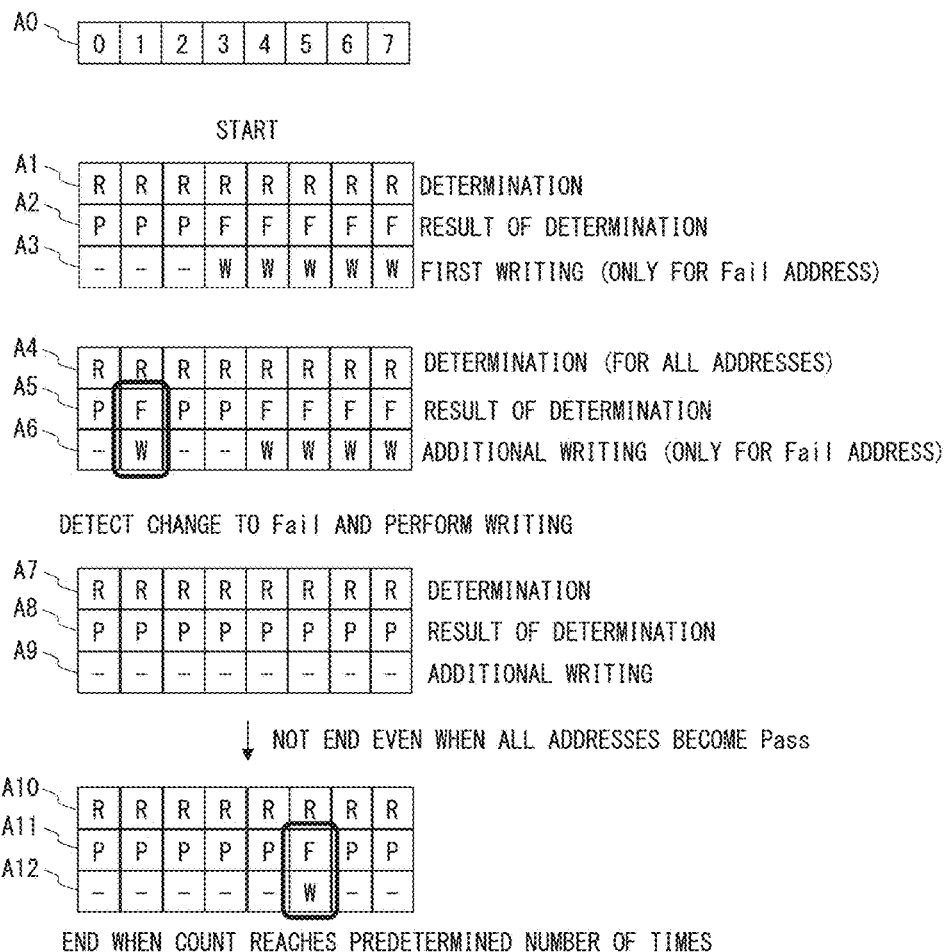
FIG. 6 is a diagram that exemplifies a state of each address in the Off writing of the nonvolatile semiconductor memory device according to the first embodiment in matrix, with each column indicating each address to which data is to be written and each row indicating the state of each address.

FIG. 6 is a diagram that exemplifies the state of each address in the Off writing of the nonvolatile semiconductor memory device according to the first embodiment in matrix, with each column indicating each address to which data is to be written and each row indicating the state of each address.

As shown in FIG. 6, the state of each address changes as the row goes downward.

The row A0 in FIG. 6 indicates each address to which data is to be written. The left end indicates an address 0. The right end indicates an address 7. While the addresses to which data is to be written are eight addresses formed of eight bits in FIG. 6, it is not limited to this example. The addresses to which data is to be written may have 128 bits, 256 bits, or more.

The row A1 in FIG. 6 indicates that a determination (R) has been started for each address to which data is to be written. For example, the ReRAM can be randomly accessed. Therefore, the Off writing operation can be started from the determination. The row A2 indicates the result of the determination of each address. For example, addresses 0 to 2 are Pass (P) and addresses 3 to 7 are Fail (F). The row A3 indicates writing (W) is performed for the addresses 3 to 7 that have been determined to be Fail. The writing performed for the first time is referred to as a first writing. Data is not written to the addresses 0 to 2.

Next, the row A4 indicates that a determination is performed for all the addresses 0 to 7 to which data is to be written regardless of the preceding determination results. The row A5 indicates the result of the determination of each address to which data is to be written. The addresses 0, 2, and 3 are Pass (P) and the addresses 1 and 4 to 7 are Fail (F). A change in the address 1 to Fail is detected. The row A6 indicates that writing is performed for the addresses 1 and 4 to 7 in which the result of the determination was Fail. The second writing and the following writing are referred to as an additional writing. Data is not written to the addresses 0, 2, and 3. The row A7 indicates that a determination is performed for all the addresses 0 to 7 to which data is to be written regardless of the preceding determination results.

The row A8 indicates that all the addresses 0 to 7 to which data is to be written are Pass. The row A9 indicates that there is no address to which data is additionally written since there is no address that has been determined to be Fail. As described above, it may be possible that all the addresses 0 to 7 to which data is to be written become Pass. Even in this case, the writing operation is not completed and the determination and the additional writing are repeated a predetermined number of times. That is, even when all the addresses become Pass, the writing operation is not completed.

The row A10 indicates that a determination is performed for all the addresses 0 to 7 to which data is to be written regardless of the preceding determination results. The row A11 indicates that the address 5 which is determined to be Pass in the determination of the row A7 is also changed to Fail. In this case, as shown in the row A12, data is written to the address 5. As described above, the cycle of the determination and the writing is repeated a predetermined number of times. When this cycle reaches the predetermined number of times, the writing operation is ended.

Next, effects of the nonvolatile semiconductor memory device 100 according to this embodiment will be described after an erroneous Pass, a false Fail, an On-stuck, and an Off-stuck in the address to which data is to be written will be described.

Figure 7A:
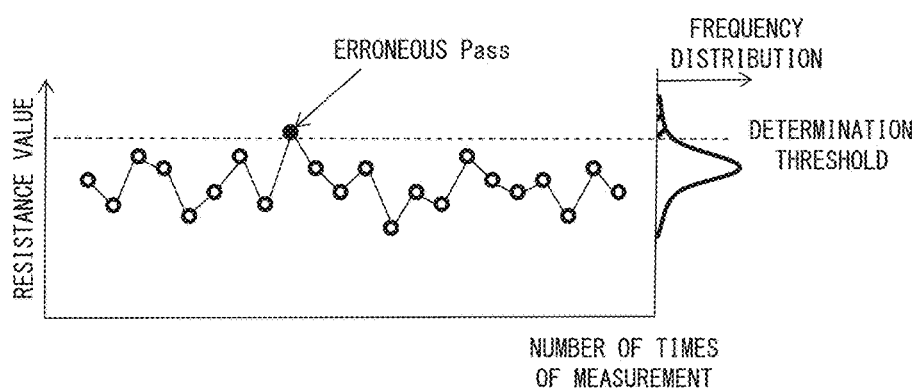
FIG. 7A and FIG. 7B show graphs each exemplifying a behavior of a variation of a resistance of a variable resistance element, with a horizontal axis indicating the number of times measurement is performed and a vertical axis indicating a resistance value.
Figure 7B:
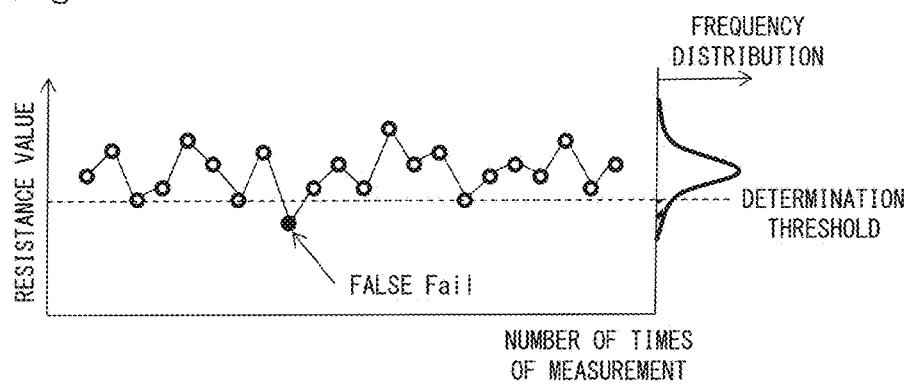

FIGS. 7A and 7B are graphs each exemplifying a behavior of a variation of the resistance of the variable resistance element 13, with the horizontal axis indicating the number of times measurement is performed and the vertical axis indicating a resistance value.

In a typical ReRAM, the variation of the resistance in the variable resistance element 13 may be large when, in particular, the variable resistance element 13 is in a high resistance state, and may exhibit different values every time the measurement is performed. In the ReRAM, the average value of the resistance values (hereinafter it will be referred to as an "average resistance value") of the variable resistance element 13 is set to an original resistance value of the variable resistance element 13.

As shown in FIG. 7A, the resistance values of the variable resistance element 13 yield a distribution profile representing a wide range from a high-resistance side to a low-resistance side with the average resistance value as a center as the number of times measurement is performed increases. The width of the distribution depends on the characteristics of the variable resistance element 13. When a frequency distribution is obtained, a value that is significantly deviated from the average resistance value stochastically appears. Therefore, the determination of the resistance value of the variable resistance element 13 by a single measurement may cause an erroneous determination.

In principle, it is required to measure the resistance value a plurality of times and to obtain the average value thereof. Assume a case, for example, in which one address is determined to be Pass as it has exhibited a resistance value higher than the determination threshold in the verify writing. However, the resistance values of the variable resistance element 13 tend to be distributed randomly (vary). Therefore, there is a probability that "erroneous Pass", in which the address, whose average resistance value is in the area of Fail, is accidentally determined to be "Pass" since it has exhibited a resistance value lower than the determination threshold, has occurred.

On the other hand, as shown in FIG. 7B, assume a case in which an address in which the average resistance value is higher than the determination threshold has been correctly determined to be Pass in the verify writing. However, there is a probability that "false Fail", in which this address is determined to be Fail since it has exhibited a resistance value lower than the determination threshold in the reading process, has occurred. In order to make a correct determination, a single determination of Pass or Fail is not sufficient. It is required to perform the measurement of the resistance value a plurality of times, obtain the average resistance value, and confirm that the average resistance value is higher than the determination threshold. The above operation needs to be performed in the determination in the writing in order to prevent the "erroneous Pass" and in the determination in the reading in order to prevent the "false Fail".

However, in general, a high-speed operation in accordance with an operation speed of a CPU is required in the reading operation. Therefore, in the reading operation, such a specific operation to measure the resistance value a plurality of times cannot be performed. Therefore, when data is written, it is required to take any measure to prevent the occurrence of the "false Fail" in the reading process. It may be possible to set the determination threshold of the writing verify to be high so that the reading variation has no influence. However, a simple increase in the determination threshold is not enough to prevent the "false Fail".

Figure 8A:
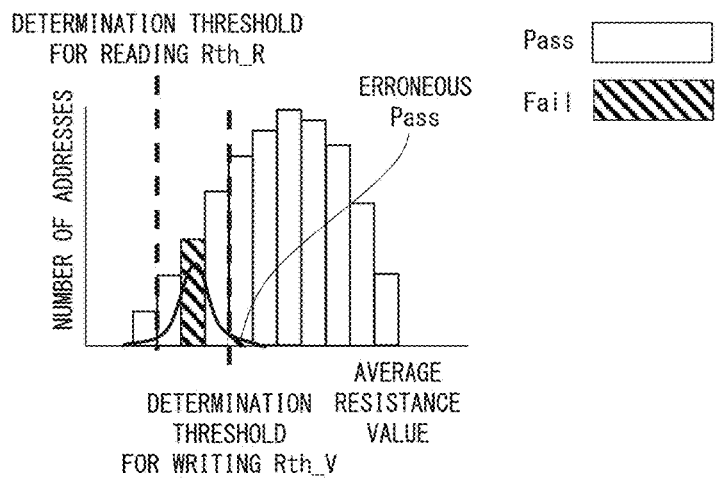
FIG. 8A, FIG. 8B and FIG. 8C show graphs each exemplifying changes in a resistance value distribution when one verify writing is performed, with a horizontal axis indicating a resistance value, a vertical axis indicating the number of addresses, FIG. 8A showing an initial state, FIG. 8B showing a resistance value distribution when a determination is performed, and FIG. 8C showing a resistance value distribution when a verify writing is performed.
Figure 8B:
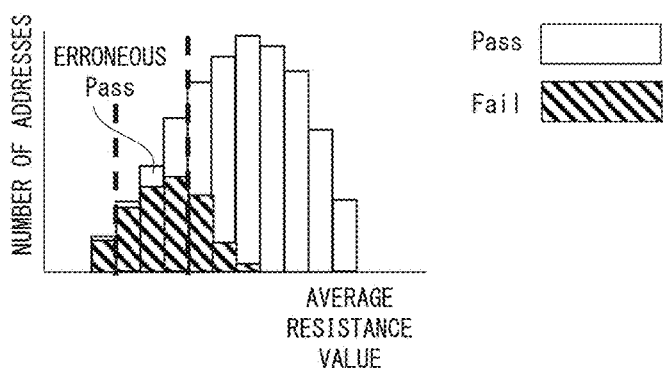
Figure 8C:
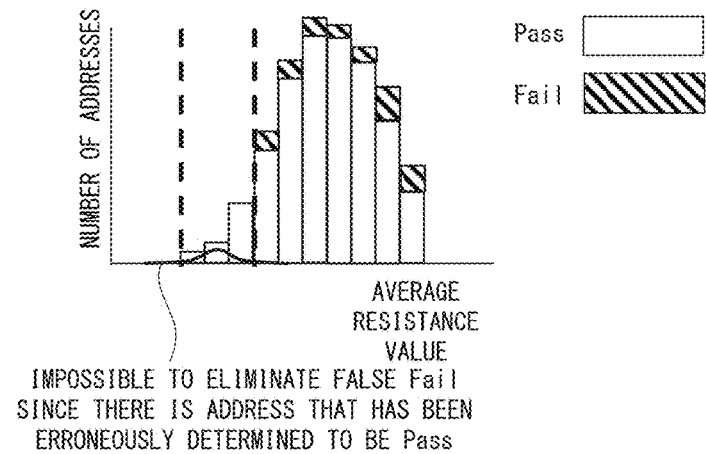

FIG. 8A, FIG. 8B and FIG. 8C show graphs each exemplifying changes in the resistance value distribution when one verify writing is performed, with the horizontal axis indicating a resistance value and the vertical axis indicating the number of addresses. FIG. 8A shows the initial state, FIG. 8B shows the resistance value distribution when the measurement is performed, and FIG. 8C shows the resistance value distribution when the verify writing is performed.

As shown in FIG. 8A, the distribution of the average resistance value in the initial state includes components higher than and lower than a determination threshold Rth_R to perform the reading operation and a determination threshold Rth_V to perform the verify writing. The determination threshold Rth_V is set to a high value so that it is possible to sufficiently decrease the probability that the false Fail occurs in the reading determination as compared to the determination threshold Rth_R when the average resistance value is higher than the determination threshold Rth_V.

FIG. 8B shows a distribution of the results when the Pass/Fail determination is performed as compared to the determination threshold Rth_V in the initial state. The address in which the average resistance value is lower than the determination threshold Rth_V should be determined to be Fail. Almost all the addresses in which the average resistance value is sufficiently lower than the determination threshold Rth_V are determined to be Fail. However, as the average resistance value approaches the determination threshold Rth_V from a side lower than the determination threshold Rth_V, the probability that the resistance happens to become higher than the determination threshold Rth_V and the address is erroneously determined to be Pass increases due to the variation of the resistance value. The success rate of the determination at around the determination threshold Rth_V is about 1/2.

FIG. 8C shows a distribution when the additional writing is performed for the address that has been determined to be Fail and the resistance is made higher than the determination threshold. Rth_V. Since there is an erroneous Pass when the determination is performed, it impossible to eliminate the address where the average resistance value is lower than the determination threshold Rth_V even when the additional writing after the verification is successively completed. Therefore, there is a probability that such an address causes the false Fail. That is, even when the determination threshold Rth_V is set high to prevent the false Fail, the probability of the erroneous Pass as compared to the determination threshold Rth_V needs to be sufficiently reduced in order to obtain sufficient effects.

Further, when the determination threshold is set too high, it is required to make the Off writing conditions necessary to pass the determination threshold strong (e.g., the voltage is made high and the pulse width is increased), which causes a new problem. When the Off writing is performed for the ReRAM, if the conditions are made strong, the resistance value of the Off state can be increased. However, in such a case, there is a problem On-stuck (short-circuit failure), in which the high resistance layer formed when the Off writing is performed is broken down due to the writing and the state does not become the Off state. There is another problem of Off-stuck (open failure), in which the Off resistance becomes so high that the state does not go back to the On state where the resistance is low.

Figure 9:
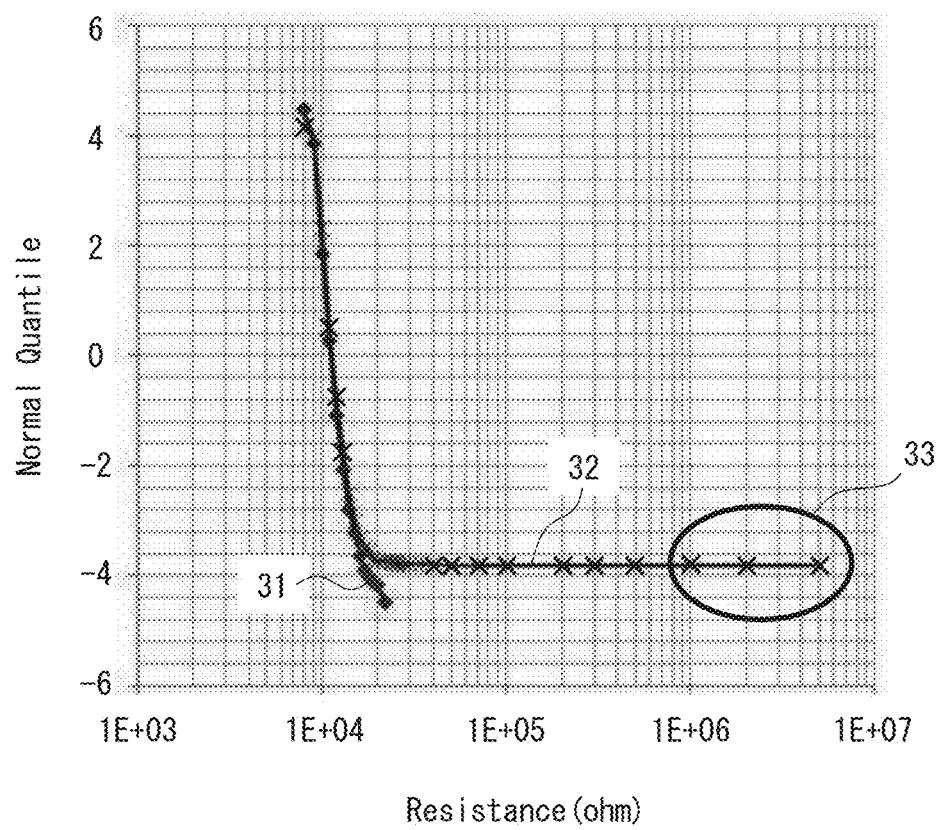
FIG. 9 is a graph that exemplifies, for each of a case in which the Off writing is performed in a short pulse and the Off writing is performed in a long pulse, an On resistance distribution when the On writing is performed in the short pulse after the Off writing is performed in the short pulse and the On writing is performed in the long pulse after the Off writing is performed in the long pulse.

FIG. 9 is a graph that exemplifies, for each of a case in which the Off writing is performed in a short pulse and the Off writing is performed in a long pulse, an On resistance distribution when the On writing is performed in the short pulse after the Off writing is performed in the short pulse and the On writing is performed in the long pulse after the Off writing is performed in the long pulse.

As shown in FIG. 9, when the Off writing is performed in the short pulse (short pulse 31), the resistances of all the addresses become equal to or lower than 30 kΩ. On the other hand, when the Off writing is performed in the long pulse (long pulse 32), the addresses whose resistances are equal to or larger than 1 MΩ, which is extremely high, are generated (area 33). This is because there are addresses where the Off-stuck has occurred. While mentioned above as the strong conditions to perform the Off writing is to increase the pulse length, it is not limited to it. A similar phenomenon occurs also when the voltage is increased as the strong conditions to perform the Off writing.

Figure 10:
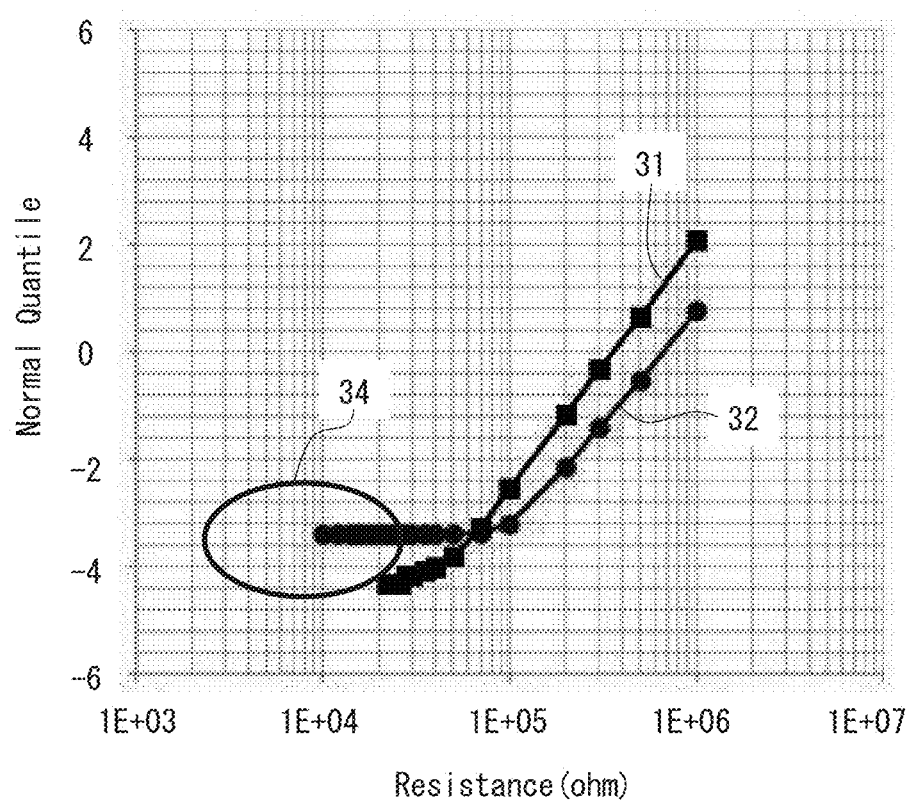
FIG. 10 is a graph that exemplifies Ps an Off resistance distribution of the case in which the Off writing is performed in a short pulse and the Off writing is performed in a long pulse.

FIG. 10 is a graph that exemplifies an Off resistance distribution when the Off writing is performed in a short pulse and the Off writing is performed in a long pulse.

As shown in FIG. 10, when the Off writing is performed in the long pulse (long pulse 32), the resistance distribution is shifted to a higher resistance side compared to the case in which the Off writing is performed in the short pulse (short pulse 31). That is, the resistance becomes high in average. However, a low-resistance address which is not in the Off writing state remains in the tail of a low resistance side (area 34). The application of the long pulse increases the voltage stress applied to the high resistance state with respect to the Off writing state. Accordingly, the variable resistance layer 13b of the variable resistance element 13 is broken down. As a result, an address that cannot increase the resistance is generated. Such a state is the On-stuck, in which the state does not change to the Off state even after the Off writing is performed. In order to prevent these problems, it is required to moderate the conditions of the Off writing as much as possible. Due to the above reason, an operation of continuing the Off writing for the variable resistance element 13 which is in the high-resistance Off state needs to be suppressed as much as possible.

Next, in association with the erroneous Pass, the false Fail, the Off-stuck, and the On-stuck described above, effects of this embodiment will be described.

As described above, in order to prevent the erroneous Pass and the false Fail, it is required to perform the determination and the writing a plurality of times. In the nonvolatile semiconductor memory device 100 according to this embodiment, the determination is performed also for the address that has been determined to be Pass a predetermined number of times. Further, even when all the addresses are determined to be Pass, the verify writing processing is not completed and these operations are repeated a predetermined number of times. Therefore, even when the erroneous Pass occurs in the first cycle, for example, the erroneous Pass can be detected by the determination in the second cycle or the following cycle. Further, the additional writing can be performed for the erroneous Pass that has been detected.

When the average resistance value is slightly lower than the determination threshold but is substantially equal to it, the probability that the erroneous Pass occurs is about 1/2. Accordingly, when the average resistance value is substantially equal to the determination threshold, half the Fail addresses evade the determination. Accordingly, half the Fail addresses become erroneous Pass. Considering a case in which the determination is performed ten times, the probability that the erroneous Pass occurs ten consecutive times is 1/1024=0.1%. Therefore, when the determination is performed ten times, the defective rate can be significantly reduced. That is, if the resistance can be made sufficiently higher than the determination threshold by one additional writing, the probability that the Fail address evades the determination can be reduced to 0.1% by performing the determination and the additional writing ten times.

Further, there is a probability that an address in which the average resistance value is higher than the determination threshold after the writing is completed is determined to be Fail (false Fail) due to a reading variation in the case of the average resistance value for which there is a probability of 10% that it is determined to be "failure", for example, there is a probability of only 10% that the detection can be performed in one determination. However, the determination is repeated ten times, the probability that the false Fail occurs increases, whereby there is a higher probability that the detection can be performed. Therefore, by performing the additional writing, it is possible to increase the average resistance value and to decrease the occurrence rate of the false Fail, that is, the defective rate. That is, the probability that the false Fail does not occur even once in the ten determinations is the tenth power of 0.9, which is 0.35. Therefore the detection rate of 10% is increased to 65%. As described above, the nonvolatile semiconductor memory device 100 according to this embodiment is able to suppress the occurrence of the erroneous Pass and the false Pass and to perform a determination in accordance with the average resistance value, whereby it is possible to improve the writing and reading accuracies.

Further, in this embodiment, the verify writing is not ended even after all the addresses become Pass. Therefore, by defining the number of iterations, the verify writing can be performed with a desired accuracy. Further, this accuracy can be assured.

Since the ReRAM can be randomly accessed, the Off writing operation can be started from the determination. It is possible to omit unnecessary operations of the verify writing and to improve the writing speed.

Further, in the nonvolatile semiconductor memory device 100 according to this embodiment, when the determination is performed, data is written to the Fail address and data is not written to the Pass address. Therefore, an excessive writing is not performed for the address to which data is to be written. It is therefore possible to suppress the occurrence of the On-stuck and the Off-stuck.

As described above, in the nonvolatile semiconductor memory device 100 according to this embodiment, it is possible to improve the accuracy of writing and reading the ReRAM. Since the amount of the current necessary to write data into the ReRAM is smaller than that in the flash memory and the writing speed in the ReRAM is higher than that in the flash memory, power consumption can be reduced in the ReRAM. Therefore, the ReRAM is suitably used when it is strictly required to reduce power consumption. For example, a semiconductor device such as a microcomputer (microcontroller, microcomputer, MCU) including an RF communication function is used for a sensor node that constructs a network called a sensor network or Internet of Things (IoT). In the microcomputer including the RF communication function, it is difficult to individually provide a power supply line for each node. Therefore, the microcomputer including the RF communication function preferably supplies power by a battery or an energy harvesting device such as a solar cell. Therefore, the ReRAM in which the defective rate of the reading and the writing is dramatically reduced according to this embodiment is used as the microcomputer including the RF communication function. It is therefore possible to supply a highly reliable sensor node that consumes a small amount of power.

COMPARATIVE EXAMPLE

The characteristics of the nonvolatile semiconductor memory device 100 according to this embodiment will be described in further detail by comparing the embodiment with a comparative example.

Figure 11:
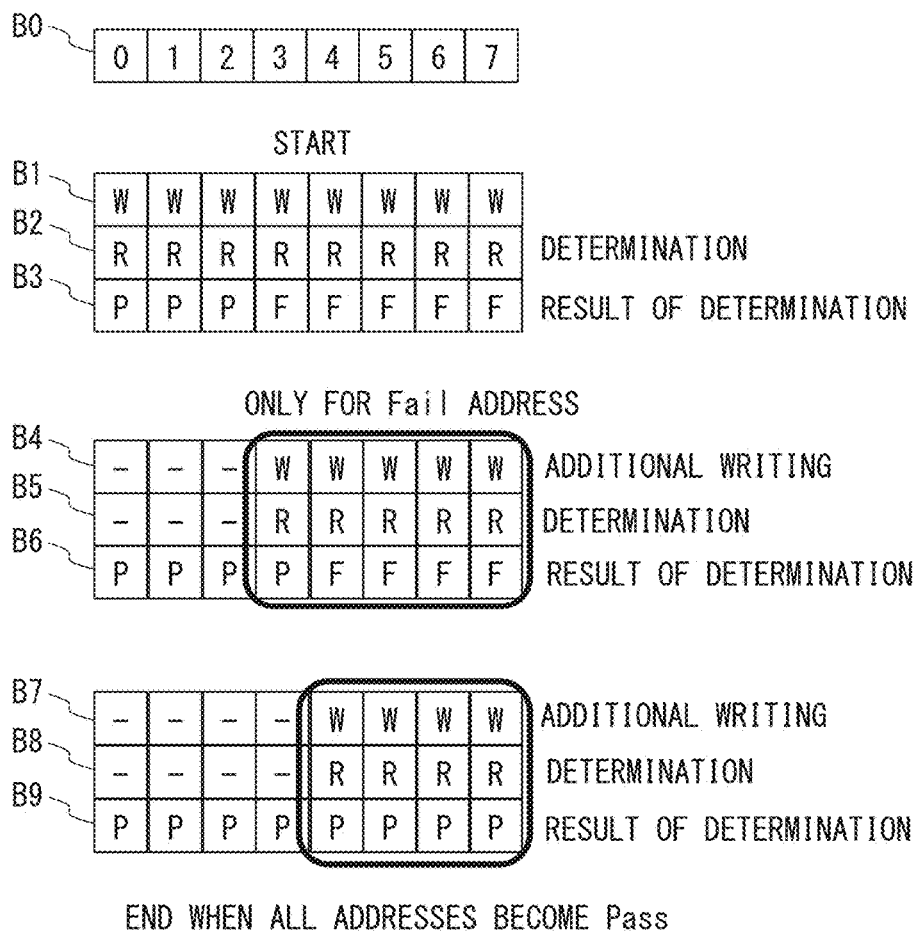
FIG. 11 is a diagram that exemplifies an operation of each address in an Off writing of a nonvolatile semiconductor memory device according to a comparative example in matrix, with each column indicating each address to which data is to be written and each row indicating a state of each address.

FIG. 11 is a diagram that exemplifies an operation of each address in an Off writing of a nonvolatile semiconductor memory device according to the comparative example in matrix, with each column indicating each address to which data is to be written and each row indicating the state of each address.

As shown in FIG. 11, the state of each address changes as the row goes downward.

The row B0 in FIG. 11 indicates each address to which data is to be written. The left end indicates the address 0. The right end indicates the address 7.

The row B1 in FIG. 11 indicates that writing (N) to each address to which data is to be written has been started. In the case of a flash memory, for example, data is deleted before writing is performed and all the addresses are 0. Therefore, in the first cycle, writing is performed first. The row B2 indicates that a determination (R) has been performed for each address to which data is to be written. The row B3 indicates the result of the determination of each address. For example, the addresses 0 to 2 show the result of Pass (P) and the addresses 3 to 7 show the result of Fail (F).

The row B4 indicates writing (W) is performed for only the addresses 3 to 7 which have been determined to be Fail. In the addresses 0 to 2, writing is not performed. Next, the row B5 indicates that the determination is performed for the addresses 3 to 7 which have been determined to be Fail. No determination is performed for the addresses 0 to 2 that have been determined to be Pass. The row B6 indicates the results of the determination. The address 3 is Pass. The addresses 4 to 7 are Fail. The address that has been determined to be Pass in the preceding cycle is treated as Pass in the following processing. Neither the determination nor the additional writing is performed for the address that has once determined to be Pass.

The row B7 indicates that data is written to the addresses 4 to 7 in which the result of the determination was Fail. The row B8 indicates that a determination is per formed for the addresses 4 to 7 in which the result of the determination was Fail. The row B9 indicates that all the addresses to which data is to be written are Pass.

The determination and the writing are repeatedly performed until the time all the addresses become Pass. When all the addresses become Pass, the verify writing processing is completed. The maximum number of iterations may be defined. In this case, if not all the addresses have been determined to be Pass when the count has reached a specified number of times, it is regarded that the writing has been failed.

In the comparative example, neither the determination nor the writing is performed for the address which has once been determined to be Pass. Therefore, when there is a variation in the characteristics of the address as in the resistance value of the ReRAM, it is impossible to accurately write data. For example, the address whose average resistance value is equal to or smaller than the determination threshold should be determined to be Fail. However, in the comparative example, the address which happened to exhibit a big resistance value is erroneously determined to be Pass. When the average resistance value is somewhat lower than the determination threshold, the probability of the erroneous determination becomes about 1/2. Therefore, in the comparative example, the probability that the address having such an average resistance value is erroneously determined is 1/2, and it is impossible to accurately write data. Further, even when the average resistance value is higher than the determination threshold and is thus determined to be Pass, there is also a probability that the address is determined to be Fail since it exhibits a resistance lower than the determination threshold due to a variation in the reading. According to such a phenomenon, the writing or reading failure frequently occurs in the comparative example.

There is also another verify writing method in which the variation of the value in the address is considered. In a flash memory, for example, there is known a problem that it causes a variation in a threshold of a memory cell due to a writing disturb for a neighbor cell. One method to deal with this problem is an operation method for determining Pass or Fail after the writing operation is completed, as disclosed in Japanese Patent. No. 3796851. In this method, after all the addresses have been determined to be Pass by the verify writing according to the method of the comparative example, the Pass/Fail determination is performed again for all the addresses, and the verify writing is again performed for the address which has been determined to be Fail.

When the number of iterations of the writing operation is large, the writing disturb may occur again. Therefore, the verify writing is completed in the small number of iterations. That is, the re-determination and the verify writing according to the comparative example for all the addresses are performed until the time all the addresses are determined to be Pass. Another example in which it is regarded that the writing disturb has not occurred when all the addresses are determined to be Pass in one determination in the first verify writing and the process does not go to a re-determination loop is also described.

However, the phenomenon occurring in the ReRAM occurs independently of an external factor such as the writing disturb. The measurement result varies for each time the reading is performed. Therefore, the resistance value has a probability distribution defined by the variation width and the average resistance value. Therefore, it is impossible to determine Pass/Fail by one reading in principle. As described above, for example, the probability that the address having an average resistance somewhat lower than the determination threshold is erroneously determined to be Pass is about 1/2. Even when it is checked again whether the variation of the resistance of the address occurs or not, the probability of the erroneous Pass can only be reduced to 1/4 at most.

Japanese Patent No. 3796851 further discloses that the re-determination and the verify writing of all the addresses are repeated until the time the verify writing is completed in a small number of iterations. Some addresses may be subjected to the determination repeatedly even after they have been determined to be Pass, similar to this embodiment. However, the number of times of iterations is determined according to the conditions that the verify writing for other addresses is completed and the number of times that is necessary to sufficiently improve the accuracy is not secured. Even when the upper-limit value of the number of iterations is determined, the process may end before the count reaches the upper-limit value and this method is not therefore sufficient. Further, when the termination conditions are satisfied, no further determination is performed for the address that has been determined to be Pass at the last stage. In this state, it cannot be said that the writing has been actually completed.

That is, the result of one determination is not necessarily correct in an element like the ReRAM in which there is a significant variation in the resistance. Therefore, according to the writing method based on the fact that the result of one Pass/Fail determination is correct as described in the comparative example, it is impossible to accurately perform writing. Further, the accurate writing is not secured. In the nonvolatile semiconductor memory device 100 according to the first embodiment, the accuracy of the writing is significantly improved including preventing the erroneous determination in the reading operation based on the behavior of the element that it is stochastically determined to be Pass or Fail.

In order to accurately perform the verify writing for the ReRAM, it is required to perform an operation of measuring the resistance a plurality of times, not the Pass/Fail determination, to acquire the resistance variation distribution of the address, and when the probability that this address will become Fail is high as a result of the determination, perform the additional writing and when the probability thereof is sufficiently low, determine that this address is Pass. This requires a circuit that performs an analog measurement of the resistance or a similar circuit, a memory element that holds multiple measurement results, and enormous amount of measurement time and power. Therefore, it is not practical to actually perform this operation.

Another method to simply obtain the effect same as that in the above method is an operation method of the nonvolatile semiconductor memory device 100 according to the first embodiment. Whether to perform the additional writing is determined based on whether the probability that the address will become Fail is high or low. Accordingly, even when the average resistance value or the variation width is not acquired, it is sufficient to obtain only the result indicating whether the probability that the address is determined to be Fail as compared to the determination threshold is high. When the determination is performed as compared to the fixed determination threshold a plurality of times, the Fail address is detected for the address that is highly likely to become Fail. It is therefore possible to efficiently execute the detection and writing of the address to which data needs to be additionally written. In the nonvolatile semiconductor memory device 100 according to this embodiment, the success rate (accuracy) of the writing or the reading is dramatically improved based on the above operation principle.

MODIFIED EXAMPLE 1

Next, a modified example 1 according to the first embodiment will be described. The modified example 1 is an example in which the conditions to perform writing are modified. That is, when data is written to increase the resistance, the resistance of the variable resistance element 13 is increased after it is once decreased.

In the first embodiment described above, when the determination and the Off writing are repeated in the verify writing processing, the Off writing is performed under the same conditions. More specifically, the same voltage is applied to write data to increase the resistance of the variable resistance element 13. In the modified example 1, when data is written to increase the resistance of the variable resistance element 13, the pulse voltage having the polarity the same as that in the On writing is once applied to decrease the resistance. After that, a voltage for the Off writing is applied to increase the resistance.

When the Off data is overwritten to the ReRAM, the resistance becomes gradually higher. However, repeating the Off writing is equal to performing the strong (high voltage, long pulse width, etc.) Off writing. Therefore, as described above, this operation may cause the Off-stuck or the On-stuck. In the Off writing operation method according to the first embodiment, in particular, the determination is continued a predetermined number of times also for the address that has been determined to be Pass. When this address is determined to be Fail as a result of the determination, the additional Off writing performed. Therefore, the frequency of the additional Off writing becomes higher. In this modified example, the state is once returned to the On state before the Off writing is performed. It is thus possible to suppress the strong Off writing conditions.

When a normal On writing operation is performed as an operation to return the state to the On state, this operation is just the repeat of the On/Off operations by a single pulse. This operation cannot absolutely cause an increase in the resistance by the additional Off writing, that is, an increase in the resistance to a value equal to or larger than the determination threshold. Therefore, in the modified example 1, a weak On writing operation is performed. Specifically, in the normal On writing, a limiting current is 175 μA and a pulse of 1 μs is applied to the plate line with a voltage of 2.2 V. However, in this modified example 1, the limiting current is reduced to 50 μA and the plate voltage is reduced to 1.0 V. Otherwise, the pulse width is reduced to 10 ns. In this way, the weak On writing is performed. Therefore, the state becomes the On state in which the resistance is higher than the normal state. Then, the resistance can be easily increased by the following Off writing. Therefore, by performing the additional writing, the resistance can be made higher than the determination threshold. As described above, according to this modified example, it is possible to suppress the occurrence of On-stuck/Off-stuck by the strong Off writing while maintaining the accuracy of the writing.

MODIFIED EXAMPLE 2

Next, a modified example 2 according to the first embodiment will be described. This modified example shows another additional writing method. That is, writing to increase the resistance is performed by applying a voltage to the variable resistance element 13, a step of repeating processing of the determination and the writing at a first voltage and a step of repeating processing of the determination and the writing at a second voltage after the preceding step are included, in which the second voltage is set higher than the first voltage.

In the Off writing conditions according to the first embodiment, a voltage of 2.2 V is applied to the bit line BL with a pulse of 20 ns, for example. In this modified example 2, as additional writing conditions, the pulse width is fixed to 10 ns and the bit line BL voltage is boosted by the unit of 0.1 V as the number of iterations increases . In this way, the voltage is changed within a range from 1.8 V to 2.5 V. In this method, for the address whose resistance becomes sufficiently high under the weak writing conditions in which the applied voltage is 1.8 V and the pulse width is 10 ns, the writing is performed under the weak conditions. For the address whose resistance does not become sufficiently high under the weak writing conditions, the writing conditions are gradually intensified. It is therefore possible to increase the resistance of the Off writing under the weak writing conditions as much as possible. The voltage may not be boosted for each iteration. For example, when the voltage is low, the voltage may be boosted for each iteration and when the voltage becomes somewhat higher, the voltage may be boosted for every two iterations or every three iterations. The boosting method is not limited as long as the first voltage when the number of iterations is small becomes lower than the second voltage when the number of iterations is large.

Another method to obtain a similar effect is, for example, to fix the voltage to 2.5 V and increase the pulse width from 10 ns to 100 ns as the number of iterations increases. The method to increase the pulse width is not limited to the method of increasing the pulse width every time the number of iterations increases. For example, when the voltage is low, the voltage may be boosted for each iteration and when the voltage becomes somewhat higher, the voltage may be boosted for every two iterations or every three iterations. A step of repeating the processing of the determination and the writing in a first pulse width and a step of repeating the determination and the writing in a second pulse width after the preceding step are included, and the second pulse width is set larger than the first pulse width. The method of increasing the pulse width is not limited as long as the first pulse width when the number of iterations is small becomes smaller than the second pulse width when the number of iterations is large.

The effect may be multiplied by combining the changes in the voltage and the pulse width. Alternatively, when the resistance is unlikely to be increased at a low voltage and for a short time, the pulse width may be increased in a low voltage and the pulse width may be decreased in a high voltage.

By making the Off writing conditions stronger as the number of iterations increases, the number of iterations can be reduced.

Further, in order to stabilize the resistances state after the writing is completed, the pulse voltage may be added and the variation in the reading may be further reduced. The pulse voltage is applied, for example, with the voltage of 1.5 V and the pulse width of 50 ns to the bit line. This application of the pulse voltage corresponds to low Off writing conditions. Further, the pulse voltage can be applied with the voltage of 1.5 V, the pulse width of 50 nm, and the current of 175 μA to the plate line. This pulse voltage corresponds to low On writing conditions. These pulses are applied from one to hundred times. This makes the resistance state stable it therefore possible to reduce the variation width of the resistance value and to improve the accuracy of writing.

(Second Embodiment)

Next, a second embodiment will be described in this embodiment, the determination threshold Rth_V in the verify writing is made higher than the reading determination threshold Rth_R in the reading operation.

The configuration of a nonvolatile semiconductor memory device according to this embodiment is similar to the configuration of the nonvolatile semiconductor memory device according to the first embodiment stated above.

When the probability that the address having the average resistance value of R is falsely determined to be Fail as compared to the determination threshold Rth_R is denoted by a probability Pf and the probability that the address having the average resistance value of R is erroneously determined to be Pass as compared to the determination threshold Rth_V is denoted by a probability Pp, it is possible to know the probabilities Pf and Pp in advance from a variation width of the resistance values. Further, since the probability Pp depends on the determination threshold Rth_V, it is possible to adjust the probability Pp to a desired value by adjusting the determination threshold Rth_V. When the number of iterations allowed in the verify writing operation is denoted by N, the probability Pp, that is, the determination threshold Rth_V, is set so that (N-th power of the probability Pp)×(probability Pf) becomes lower than a desired defective rate F.

Figure 12:
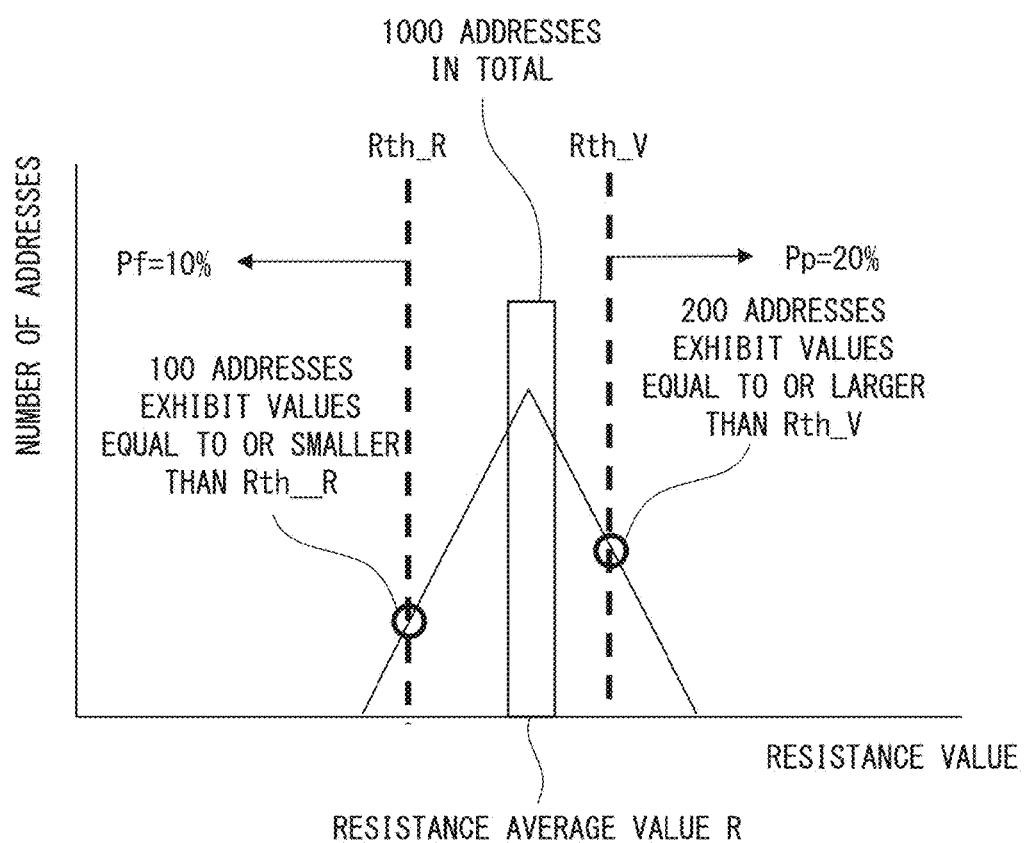
FIG. 12 is a graph that exemplifies a relation between a determination threshold and the number of addresses of a nonvolatile semiconductor memory device according to a second embodiment, with a horizontal axis indicating a resistance value and a vertical axis indicating the number of addresses.

FIG. 12 is a graph that exemplifies a relation between the determination threshold and the number of addresses of the nonvolatile semiconductor memory device according to the second embodiment, with the horizontal axis indicating a resistance value and the vertical axis indicating the number of addresses.

As shown in FIG. 12, when Pf=10% and Pp=20%, 200 out of 1000 addresses are determined to be Pass in the first determination. In the following additional writing, the number of addresses whose resistances are equal to or smaller than the determination threshold Rth_R becomes 200×10%=20. In the second determination, 40 out of 200 addresses are determined to be Pass as compared to the determination threshold Rth_V, and the number of addresses whose resistances are equal to or smaller than Rth_R is 40×10%=4. The number of addresses that are determined to be Fail in the N-th time is reduced to 1000×(N-th power of the probability Pp)×(probability Pf)

The aforementioned first embodiment is effective to reduce the erroneous Pass and the false Fail. However, when the writing verify determination is performed using the determination threshold in the reading operation, the effectiveness of reducing the defective rate becomes low. In the first embodiment, in order to make the number of addresses indicating the average resistance value substantially equal to the determination threshold $1\times10^{-3}$, for example, the determination needs to be performed ten times and order to make it $1\times10^{-6}$, the determination needs to be performed 17 times. Further, if the probability that an address whose average resistance value is higher than the determination threshold is determined to be Fail is 1%, for example, it is required to perform the measurement 100 times to detect this Fail. In order to detect the false failure that may occur with the probability of 1 ppm, it is required to perform the measurement $1\times10^6$ times. Therefore, in order to sufficiently reduce a malfunction due to a variation, in particular, the probability that the false Fail occurs, the measurement needs to be performed an enormous number of times. Therefore, it is required in practical to set the verify determination threshold to be higher than the determination value of the reading operation and to reduce the number of times measurement is performed.

Figure 13:
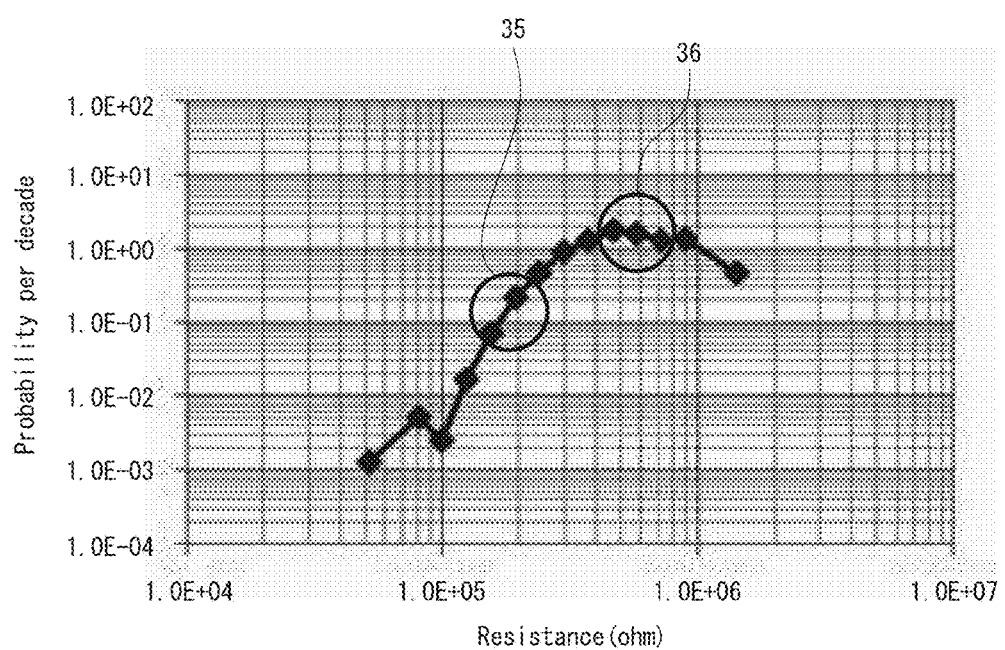
FIG. 13 is a graph that exemplifies a variation of a resistance value of an ReRAM, with a horizontal axis indicating a resistance value and a vertical axis indicating a probability.
Figure 14:
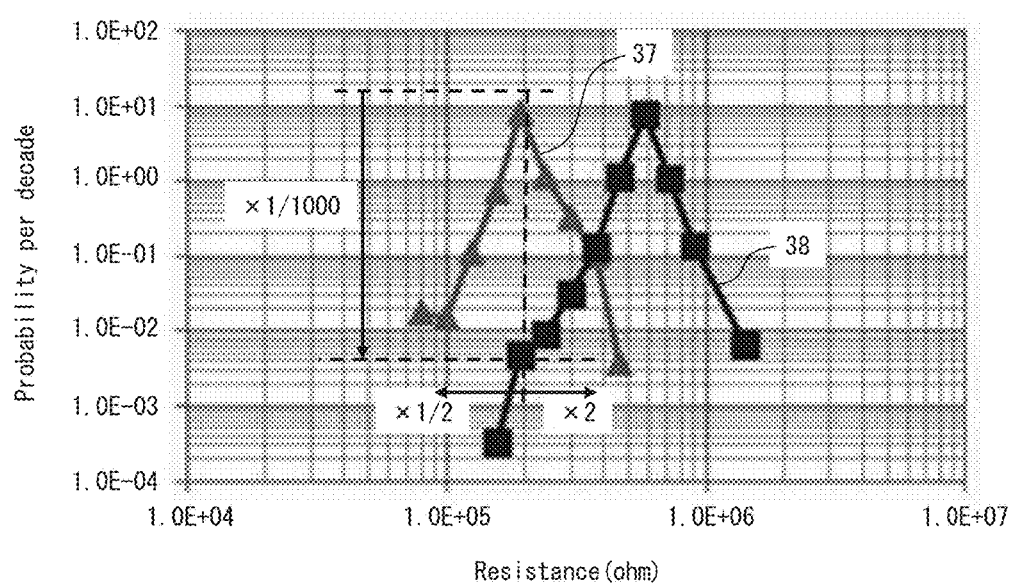
FIG. 14 is a graph that exemplifies a variation of the resistance value of the ReRAM, with a horizontal axis indicating a resistance value and a vertical axis indicating a probability.

FIGS. 13 and 14 are graphs each exemplifying a variation of the resistance value of the ReRAM, with the horizontal axis indicating a resistance value and the vertical axis indicating a probability.

As shown in FIG. 13, the average resistance value obtained by measuring the resistance 100 times is distributed from 50 kΩ to 1.5 MΩ, which is a measurement limit, with 550 kΩ as a center. The address (area 35) having the average resistance value of 200 kΩ or the address (area 36) having the average resistance value of 550 Ω will be discussed.

As shown in FIG. 14, when the measurement of the resistance is performed 100 times in a plot 37 of the address having the average resistance value of 200 kΩ, or a plot 38 of the address having the average resistance value of 550 kΩ, both the probability that it exhibits the resistance twice as large as the average resistance value and the probability that it exhibits the resistance half the amount of the average resistance value are about 0.1% regardless of the average resistance value.

Consider a case, for example, in which the determination threshold Rth_R in the reading operation is 100 kΩ, the verify writing is performed for the address having the average resistance value of 200 kΩ, and the probability that the false Fail occurs since the resistance is lower than the determination threshold Rth_R is reduced to 1 ppm or lower. Since the probability Pf that this address becomes the false Fail is 0.1%, it is required to make the probability Pp^N (N-th power of the probability Pp) 0.1% and to make the false Fail rate 0.1%×0.1%=1 ppm. When the determination threshold Rth_V in the verify writing is 100 kΩ, the probability Pp is (100%−0.1%) and the number of iterations N is about 14000. However, since the probability Pp is 50% when the determination threshold Rth_V is 200 kΩ, the number of times of the determination that is required can be significantly reduced (N=10). When the determination threshold Rth_V is set to 400 kΩ, Pp becomes 0.1%. In this case, only one determination is required.

Increasing the determination threshold Rth_V is effective not only to suppress the false Fail but also to suppress the erroneous Pass. Consider a case in which, when the determination threshold Rth_V is 100 kΩ, the number of the addresses whose average resistance values is 100 kΩ is reduced to 1 ppm. Since the erroneous Pass rate is 50%, the determination needs to be performed 17 times. However, since the erroneous Pass rate is 0.1% when the determination threshold is set to 200 kΩ, the probability can be reduced to 1 ppm in two determinations.

As described above, this embodiment gives a great effect to reduce the number of operations. A simple increase in the determination threshold may cause another problem such as an occurrence of On/Off-stuck or degradation of On state holding capabilities. However, since all the addresses are determined to be Pass or Fail each time in the verify writing operation in the method according to this embodiment, the occurrence of the On/Off-stuck and the like is minimized.

If the determination threshold is simply increased to sufficiently suppress the occurrence of the erroneous Pass and the false Fail without performing the determination of all the addresses each time, it is required to obtain the sufficient effect with the number of iterations N=1. Therefore, the determination threshold Rth_V needs to be set to 400 kΩ or larger, that is, four times larger than the determination threshold Rth_R. If the determination threshold Rth_V is set to a value smaller than 400 kΩ, the probability that the address whose average resistance value is 100 kΩ is erroneously determined to be Pass as compared to the determination threshold Rth_V cannot be reduced to 1 ppm or smaller. Further, the probability that the address whose average resistance value is 100 kΩ is falsely determined to be Fail does not become 1 ppm or smaller.

On the other hand, in the method according to this embodiment, for the address having the average resistance value equal to or smaller than 400 kΩ (e.g., 300 kΩ), the probability Pf can be made 20 ppm and the probability Pp can be made 0.5. It is therefore possible to suppress the false Fail occurrence rate to 1 ppm or lower with the number of iterations N=5. For the address having the average resistance value of 350 kΩ, the probability Pf can be made 4 ppm, the probability Pp can be made 0.8, and the number of iterations N can be made 6. In the case of the determination threshold of 300 kΩ, the probability that the address having the average resistance value of 100 kΩ is erroneously determined to be Pass is 20 ppm. Accordingly, in this case, the determination needs to be performed twice to sufficiently suppress the probability that the erroneous Pass occurs.

Figure 15:
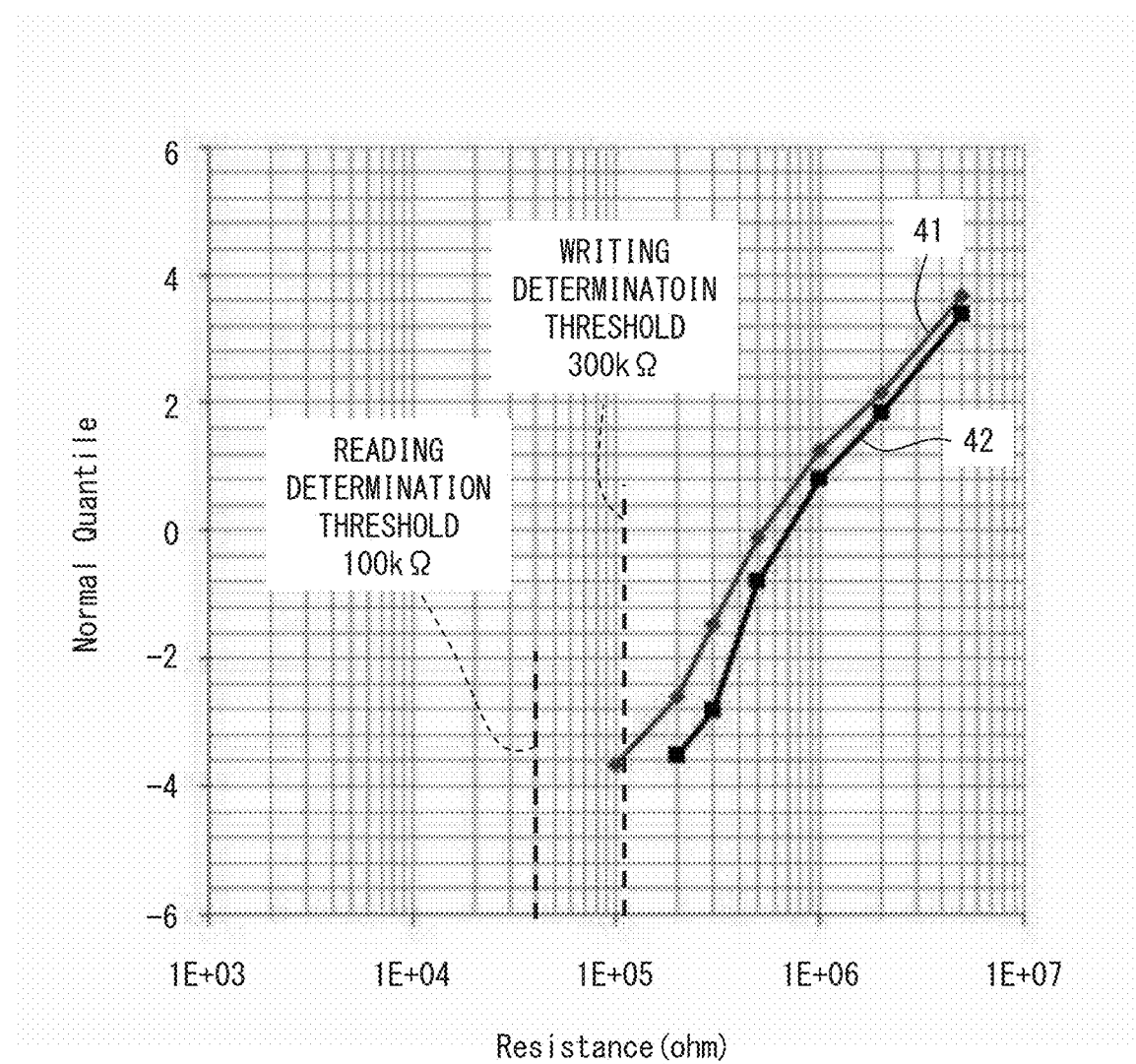

FIG. 15 is a diagram that exemplifies the resistance and the number of normalized addresses of the nonvolatile semiconductor memory device according to the second embodiment and the nonvolatile semiconductor memory device according to the comparative example, with the horizontal axis indicating a resistance value and the vertical axis indicating the number of normalized addresses.

As shown in FIG. 15, when the determination threshold Rth_R is 100 kΩ and the determination threshold Rth_V is 300 kΩ, in a plot 41 according to the comparative example, there remains a resistance distribution in a range of 300 kΩ or lower. Further, there is an address that has the resistance of 100 kΩ. On the other hand, in a plot 42 according to the second embodiment, although the writing conditions and the number of iterations are the same as those of the comparative example, the resistance distribution does not substantially reach 300 kΩ or lower and no address is detected in 100 kΩ. That is, even when the value of the determination threshold. Rth_V is insufficient in the comparative example, the erroneous Pass and the false Fail can be sufficiently suppressed in the second embodiment.

While the determination threshold Rth_V is set to 300 kΩ in this measurement result, when the number of iterations N is set to 100, the false Fail rate can be suppressed to 1 ppm or lower even when the determination threshold Rth_V is reduced to 250 kΩ, that is, 2.5 times smaller than that of the determination threshold Rth_R. How much the determination threshold Rth_V can be suppressed depends on the magnitude of the variation in the reading of the variable resistance element 13 and the allowable defective rate. When the determination threshold Rth_V is about twice as large as the determination threshold Rth_R, it is possible to reduce the defective rate with an accuracy sufficient for practical applications.

As described above, according to the nonvolatile semiconductor memory device 100 and its operation method according to the second embodiment, it is possible to significantly decrease the number of iterations required. It is also possible to lower the determination threshold that is necessary. It is therefore possible to reduce the problem caused by the strong Off writing.

(Third Embodiment)

Next, a third embodiment will be described. In this embodiment, after all the addresses to which data is to be written become Pass or quasi-Pass, the verify writing is repeated a predetermined number of times. The configuration of a nonvolatile semiconductor memory device 100 according to this embodiment is similar to the configuration of the nonvolatile semiconductor memory device 100 described in the first embodiment.

Figure 16:
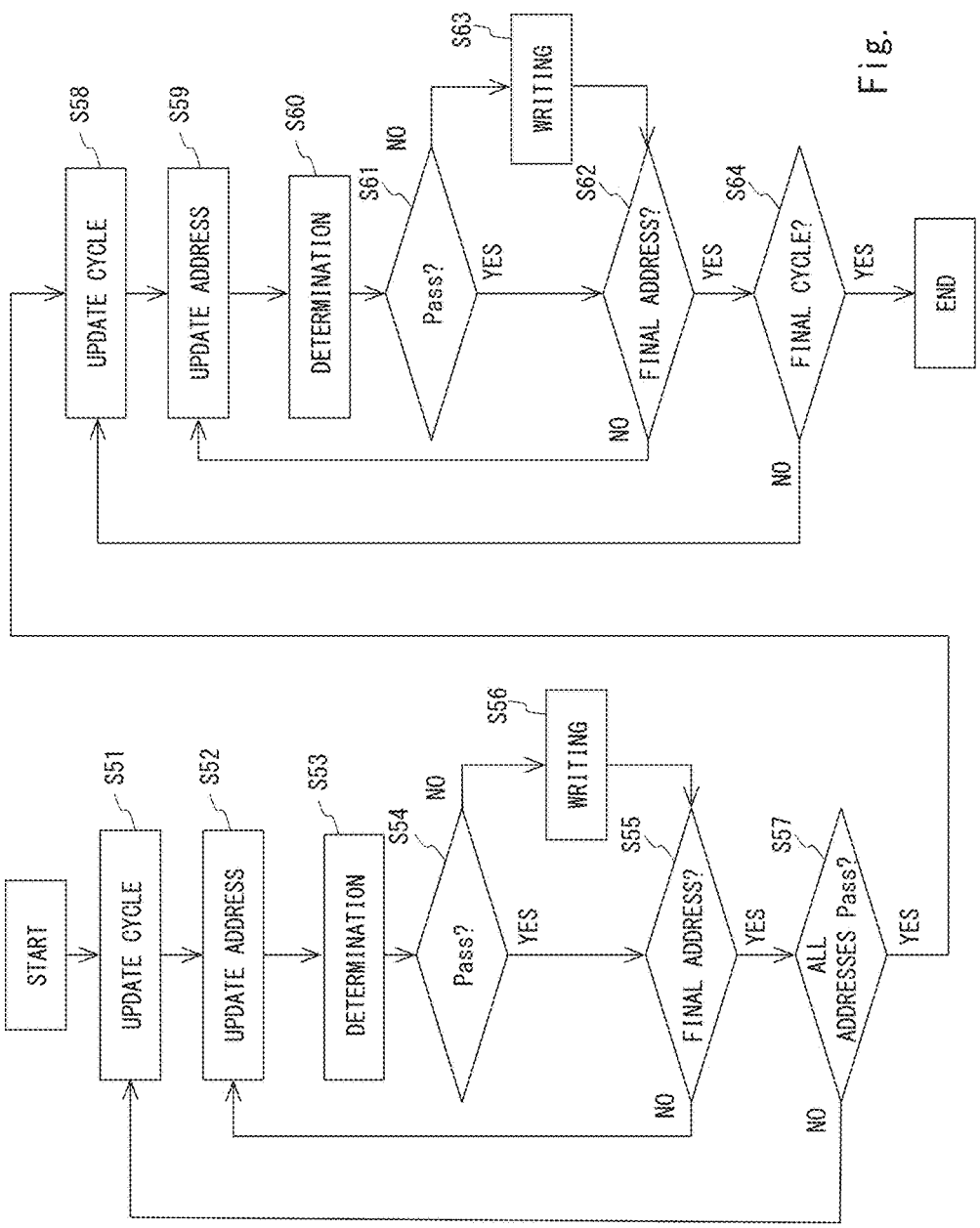
FIG. 16 is a flowchart that exemplifies a writing operation of a nonvolatile semiconductor memory device according to a third embodiment.

FIG. 16 is a flowchart that exemplifies a writing operation of the nonvolatile semiconductor memory device according to the third embodiment.

As shown in Step S51 of FIG. 16, the cycle is updated first. The update of the cycle is an operation to set the initial value to, for example, 0. In Step S51 in this embodiment, the final cycle may not be set. This is because, after all the addresses become Pass or quasi-Pass, the cycle is repeated a predetermined number of times, as will be described later. The quasi-Pass state is a state in which the defective rate can be suppressed to a value that can be rescued by error correction coding (ECC) or lower. In Step S51, the last cycle may be set. When not all the addresses are determined to be Pass, the processing may be ended at the last cycle in Step S51.

Next, as shown in Step S52, the address is updated. The update of the address is to cycle through the addresses one by one in order to determine the address to which data is to be written and to perform additional writing.

Next, as shown in Step S53, a determination is performed. Here, it is determined whether data has been sufficiently written to the plurality of addresses to which data is to be written. Similar to the first embodiment, the address to which data has been sufficiently written is Pass and the address to which data has not been sufficiently written is Fail. In the following description, the descriptions already given in regard to the first embodiment will be omitted.

Next, as shown in Step S54, it is determined whether the address that has been selected is Pass or Fail. When the address that has been selected is Pass (Yes), the process goes to Step S55. When the address that has been selected is not Pass (No), the process goes to Step S56.

As shown in Step S56, when the address that has been selected is not Pass (No), data writing is performed. The process then goes to Step S55.

As shown in Step S55, it is determined whether the address is the final address. When the address is not the final address (No), the process goes back to Step S52. Accordingly, the address is updated and the next address is selected.

When the address is the final address (Yes) in Step S55, the process goes to Step S57.

Next, as shown in Step S57, it is determined whether or not there is an address to which data has not been sufficiently written for all the addresses to which data is to be written, that is, whether all the addresses are Pass. The Pass address also includes the quasi-Pass address. When not all of the addresses to which data is to be written are Pass (No), the process goes back to Step S51. The cycle is therefore updated and the cycle is repeated until the time it is determined that there is no address to which data has not been sufficiently written. When all the addresses to which data is to be written are Pass (Yes), that is, when it is determined that there is no address to which data has not been sufficiently written, the process goes to Step S58.

Next, as shown in Step S58, the cycle is updated. The update of the cycle is an operation to set the initial value to, for example, 0. In Step S58 in this embodiment, the final cycle is set to a predetermined number of times. Therefore, after all the addresses to which data is to be written become Pass, the cycle is repeated a predetermined number of times.

Next, as shown in Step S59, the address is updated. The update of the address is to cycle through the addresses one by one to determine the address to which data is to be written and perform additional writing.

Next, as shown in Step S60, a determination is performed for the address to which data has been written and the address to which data has not been written.

Next, as shown in Step S61, it is determined whether the address that has been selected is Pass or Fail. When the address that has been selected is Pass (Yes), the process goes to Step S62. When the address that has been selected is not Pass (No), the process goes to Step S63.

As shown in Step S63, when the address that has been selected is not Pass (No), data writing is performed. The process then goes to Step S62.

As shown in Step S62, it is determined whether the address that has been selected is the final address. When the address is the final address (Yes), the process goes to Step S64. When the address that has been selected is not the final address (No), the process goes back to Step S59. Accordingly, the address is updated and the next address is selected.

As shown in Step S64, it is determined whether the cycle is the final cycle. When the cycle is not the final cycle (No), the process goes back to Step S58. The cycle is therefore repeated. On the other hand, when the cycle is the final cycle (Yes), the process ends. As described above, even after all the addresses to which data is to be written become Pass, the cycle is repeated a predetermined number of times.

In the first and second embodiments, the determination and the writing are repeated a predetermined number of times, whereby the resistance of the address that has been determined to be Pass is sufficiently checked. However, when the resistance of the variable resistance element 13 is unlikely to be increased, the number of iterations needs to be increased. When the resistance thereof is extremely unlikely to be increased, the predetermined number of iterations may not be enough.

In the third embodiment, the verify writing is repeated until the time all the addresses become Pass or quasi-Pass. After all the addresses become Pass or quasi-Pass, the verify writing is repeated a number of times required for checking the resistance. Prior to the verify writing according to the first and second embodiments, the verify writing may be performed until the time all the addresses become Pass or quasi-Pass.

That is, the third embodiment includes Step S53 in which it is determined whether data has been sufficiently written to all the plurality of respective addresses to which data is to be written and Step S56 in which data is written to the address to which data has not been sufficiently written and data is not written to the address to which data has been sufficiently written, and Steps S53 and S56 are repeated until the time it is determined that there is no address to which data has not been sufficiently written. After it is determined that there is no address to which data has not been sufficiently written, the process goes to an operation similar to the determination and the writing operation in the first embodiment and this operation is repeated a predetermined number of times. The third embodiment may also include Step S57 in which it is determined whether there is an address to which data has not been sufficiently written.

More specifically, the third embodiment includes Step S53 in which it is determined whether each of the plurality of variable resistance elements 13 has a resistance higher than the determination threshold and data is written to the low resistance element to increase the resistance and Step S56 in which data is not written to the high resistance element to increase the resistance, and Step S53 and Step S56 are repeated until the time it is determined that there is no low resistance element. After it is determined that there is no low resistance element, the process goes to a step similar to the determination and the writing operation in the first embodiment and this operation is repeated a predetermined number of times. Accordingly, the number of iterations can be adjusted according to the easiness of the writing. The third embodiment may also include Step S57 in which it is determined whether there is no low resistance element.

The operation method of the nonvolatile semiconductor memory device 100 described above may be an operation program.

Further, the operation program may be executed by a computer. In this case, the operation program includes a third step (procedure) corresponding to Step S53 for causing the computer to determine whether data has been sufficiently written to all the plurality of addresses and a fourth step (procedure) corresponding to Step S56 for causing the computer to write data to the address to which data has not been sufficiently written and causing the computer not to write data o the address to which data has been sufficiently written, causes the computer to repeat the third step (procedure) and the fourth step (procedure) until the time it is determined that there is no address to which data has not been sufficiently written, and causes the computer to go to a step (procedure) similar to the determination and the writing operation in the first embodiment after it is determined that there is no address to which data has not been sufficiently written.

More specifically, the operation program includes the third step (procedure) corresponding to Step S53 for causing the computer to determine whether each of the plurality of variable resistance elements 13 is the high resistance element or the low resistance element and the fourth step (procedure) corresponding to Step S56 for causing the computer to write data to the low resistance element and for causing the computer not to write data to the high resistance element, causes the computer to repeat the third step (procedure) and the fourth step (procedure) until the time it is determined that there is no low resistance element, and causes the computer to go to a step (procedure) similar to the determination and the writing operation in the first embodiment after it is determined that there is no low resistance element.

Therefore, the nonvolatile semiconductor memory device 100 according to the third embodiment decreases the number of iterations when data can be written with a small number of iterations. When data is not sufficiently written in the predetermined number of iterations, the number of iterations is increased. As described above, the adjustment of increasing or decreasing the number of iterations can be dynamically performed, whereby the unnecessary iterations can be omitted. It is therefore possible to reduce time until the time the writing is completed. Further, since the number of iterations for the writing is sufficient, it is possible to improve the accuracy of writing.

In the iterations until the time all the addresses become Pass or quasi-Pass, further determination for the address that has once become Pass may be omitted, like in the comparative example.

While the invention made by the present inventors has been specifically described based on the embodiments, it is needless to say that the present invention is not limited to the embodiments stated above and may be changed in various ways without departing from the spirit of the present invention.

The first to third embodiments can be combined as desirable by one of ordinary skill in the art.

While the invention has been described in terms of several embodiments, those ski I led in the art will recognize that the invention can be practiced with various modification as within the spirit and scope of the appended claims and the invention is not limited to the examples described above.

Further, the scope of the claims is not limited by the embodiments described above.

Furthermore, it is noted that, Applicant's intent encompass equivalents of all claim elements, even if amended later during prosecution.

What is claimed is:

1. A method of operating a nonvolatile semiconductor memory device comprising:
    a first operation for determining whether data has been sufficiently written to all of a plurality of addresses to which data is to be written; and
    a second operation for writing data to an address to which data has not been sufficiently written among the plurality of addresses and not writing data to an address to which data has been sufficiently written,
    wherein the first operation and the second operation are repeated a predetermined number of times.

2. The method according to claim 1, wherein the plurality of addresses to which data is to be written can be randomly accessed.

3. The method according to claim 1, wherein, in the second operation except for the last second operation, there is at least one time among the predetermined number of times that the second operation is repeated where the address to which data has not been sufficiently written is not included.

4. The method according to claim 1, comprising, prior to the first operation:
    a third operation for determining whether data has been sufficiently written to all the plurality of addresses; and
    a fourth operation for writing data to the address to which data has not been sufficiently written and not writing data to the address to which data has been sufficiently written, wherein:
    the third operation and the fourth operation are repeated until the time it is determined that there is no address to which data has not been sufficiently written; and
    the process goes to the first operation after it is determined that there is no address to which data has not been sufficiently written.

5. A method of operating a nonvolatile semiconductor memory device comprising:
    a first operation for determining whether each of all of a plurality of variable resistance elements to which data is to be written is a high resistance element whose resistance is higher than a determination threshold or a low resistance element whose resistance is lower than the determination threshold; and
    a second operation for writing data to the low resistance element among the plurality of variable resistance elements to increase the resistance and not writing data to the high resistance element among the plurality of variable resistance elements,
    wherein the first operation and the second operation are repeated a predetermined number of times.

6. The method according to claim 5, wherein, in the second operation except for the last time the second operation is repeated, there is at least one time among the predetermined number of times that the second operation is repeated in which there is no low resistance element.

7. The method according to claim 5, wherein the determination threshold is set higher than a reading determination threshold in a reading operation.

8. The method according to claim 7, wherein the determination threshold is set twice as large or larger than the reading determination threshold.

9. The method according to claim 5, wherein:
    prior to the first operation, a third operation for determining whether each of all the plurality of variable resistance elements is the high resistance element or the low resistance element and a fourth operation for writing data to the low resistance element and not writing data to the high resistance element are included,
    the third operation and the fourth operation are repeated until the time it is determined that there is no low resistance element, and
    after it is determined that there is no low resistance element, the first operation is performed.

10. The method according to claim 5, wherein in the writing, the resistance of the variable resistance element is increased after it is once decreased.

11. The method according to claim 5, wherein the writing is performed by applying a voltage to the variable resistance element, the writing includes writing performed when data is written in a first voltage and writing performed when data is written in a second voltage after the preceding writing is performed, and the second voltage is higher than the first voltage.

12. The method according to claim 5, wherein the writing is performed by applying a voltage to the variable resistance element by a pulse, the writing includes writing performed in a first pulse width and writing performed in a second pulse width after the preceding writing is performed, and the second pulse width is larger than the first pulse width.

13. A nonvolatile semiconductor memory device comprising:
    a plurality of variable resistance elements;
    a resistance determination circuit that determines whether each of all of a variable resistance elements to which data is to be written among the plurality of variable resistance elements is a high resistance element whose resistance is higher than a determination threshold or a low resistance element whose resistance is lower than the determination threshold; and
    a writing voltage setting circuit that writes data to the low resistance element among the plurality of variable resistance elements to increase the resistance and does not write data to the high resistance element, wherein:

the resistance determination circuit performs the determination for the variable resistance element to which data has been written and the variable resistance element to which data has not been written, and the determination in the resistance determination circuit and the writing in the writing voltage setting circuit are repeated a predetermined number of times.

14. The nonvolatile semiconductor memory device according to claim 13, further comprising a determination result storage circuit that stores a result of the determination for the plurality of variable resistance elements by the resistance determination circuit, wherein the determination in the resistance determination circuit and the processing in the writing voltage setting circuit are repeated even in a state in which the result of the determination indicating that the determination result storage circuit does not include the low resistance element is stored.

15. The nonvolatile semiconductor memory device according to claim 13, wherein the determination threshold is set higher than a reading determination threshold in a reading operation.

16. The nonvolatile semiconductor memory device according to claim 15, wherein the determination threshold is set twice as large or larger than the reading determination threshold.

17. The nonvolatile semiconductor memory device according to claim 14, wherein the determination in the resistance determination circuit and the processing in the writing voltage setting circuit are repeated the predetermined number of times from the state in which the result of the determination indicating that the determination result storage circuit does not include the low resistance element is stored.

18. The nonvolatile semiconductor memory device according to claim 13, wherein in the writing, the resistance of the variable resistance element is increased after it is once decreased.

19. The nonvolatile semiconductor memory device according to claim 13, wherein the writing is performed by applying a voltage to the variable resistance element, the writing includes a first operation of repeating the determination and the processing in a first voltage and a second operation of repeating the determination and the processing in a second voltage after the preceding writing is performed, and the second voltage is higher than the first voltage.

20. The nonvolatile semiconductor memory device according to claim 13, wherein the writing to increase the resistance is performed by applying a voltage to the variable resistance element by a pulse, the writing includes a first operation of repeating the determination and the processing in a first pulse width and a second operation of repeating the determination and the processing in a second pulse width after the preceding writing is performed, and the second pulse width is larger than the first pulse width.

21. The method according to claim 5, further comprises:
determining whether the predetermined number of times has been reached by comparing a current iteration count number of the first and second operations with the predetermined number, and
wherein both the first operation and the second operation are repeated until the current iteration count number equals the predetermined number.

* * * * *